(12) United States Patent
Hirase

(10) Patent No.: US 8,129,794 B2
(45) Date of Patent: Mar. 6, 2012

(54) SEMICONDUCTOR DEVICE INCLUDING MISFETS HAVING DIFFERENT THRESHOLD VOLTAGES

(75) Inventor: Junji Hirase, Osaka (JP)

(73) Assignee: Panasonic Corporation, Osaka (JP)

(*) Notice: Subject to any disclaimer, the term of this patent is extended or adjusted under 35 U.S.C. 154(b) by 340 days.

(21) Appl. No.: 12/357,869

(22) Filed: Jan. 22, 2009

(65) Prior Publication Data

US 2009/0189225 A1    Jul. 30, 2009

(30) Foreign Application Priority Data

Jan. 25, 2008  (JP) ................................ 2008-014818

(51) Int. Cl.
*H01L 21/336* (2006.01)
(52) U.S. Cl. ........ 257/369; 257/233; 257/288; 257/401; 257/901; 257/E21.409; 257/E27.064; 438/233
(58) Field of Classification Search .................. 257/369, 257/E21.409, E27.064, 288, 401, 901; 438/233
See application file for complete search history.

(56) References Cited

U.S. PATENT DOCUMENTS

| | | | |
|---|---|---|---|
| 6,373,111 B1 | 4/2002 | Zheng et al. | |
| 6,727,130 B2* | 4/2004 | Kim et al. | 438/199 |
| 6,790,731 B2 | 9/2004 | Zheng et al. | |
| 6,833,596 B2 | 12/2004 | Matsuo | |
| 2005/0064653 A1* | 3/2005 | Park et al. | 438/232 |
| 2005/0230781 A1* | 10/2005 | Ema et al. | 257/510 |
| 2006/0003507 A1* | 1/2006 | Jung et al. | 438/197 |
| 2007/0052036 A1 | 3/2007 | Luan et al. | |
| 2007/0052037 A1* | 3/2007 | Luan | 257/369 |
| 2007/0215917 A1* | 9/2007 | Taniguchi | 257/288 |
| 2008/0036008 A1* | 2/2008 | Hirase et al. | 257/369 |

FOREIGN PATENT DOCUMENTS

| | | | |
|---|---|---|---|
| JP | 2006-196610 | * | 7/2006 |
| JP | 2006-324342 | | 11/2006 |
| JP | 2007-110091 | | 4/2007 |
| JP | 2007-335783 | | 12/2007 |

OTHER PUBLICATIONS

Nakamura et al "55nm CMOS Technology for Low Standby Power/ Generic Applications Deploying the Combination of Gate Work Function Control by HfSiON and Stress-Induced Mobility Enhancement" VLSI 2006 Technology Symposium pp. 158-159.
International Search Report issued in International Patent Application No. PCT/JP2008/003898, mailed Apr. 14, 2009.

* cited by examiner

*Primary Examiner* — Marc Armand
(74) *Attorney, Agent, or Firm* — McDermott Will & Emery LLP

(57) ABSTRACT

A semiconductor device includes a first MIS transistor, and a second MIS transistor having a threshold voltage higher than that of the first MIS transistor. The first MIS transistor includes a first gate insulating film made of a high-k insulating film formed on a first channel region, and a first gate electrode having a first conductive portion provided on and contacting the first gate insulating film and a second conductive portion. The second MIS transistor includes a second gate insulating film made of the high-k insulating film formed on a second channel region, and a second gate electrode having a third conductive portion provided on and contacting the second gate insulating film and a fourth conductive portion. The third conductive portion has a film thickness smaller than that of the first conductive portion, and is made of the same composition material as that of the first conductive portion.

20 Claims, 10 Drawing Sheets

←―― Lvt region ――→←― Hvt region ―→

←—Lvt region—→←—Hvt region—→

←—Lvt region—→←—Hvt region—→

US 8,129,794 B2

SEMICONDUCTOR DEVICE INCLUDING MISFETS HAVING DIFFERENT THRESHOLD VOLTAGES

CROSS REFERENCE TO RELATED APPLICATIONS

This Non-provisional application claims priority under 35 U.S.C. §119(a) on Patent Application No. 2008-014818 filed in Japan on Jan. 25, 2008, the entire contents of which are hereby incorporated by reference.

BACKGROUND OF THE INVENTION

1. Field of the Invention

The present invention relates to a semiconductor device and its fabrication method. More particularly, the present invention relates to a semiconductor device comprising multi-Vt MISFETs (Metal Insulator Semiconductor Field Effect Transistors) having different threshold voltages, and its fabrication method.

2. Description of the Related Art

In recent years, in order to achieve a semiconductor integrated circuit device that simultaneously has high performance and low power consumption, a multi-Vt process is commonly used in which MISFETs (hereinafter referred to as "MIS transistors") that have the same conductivity type and different threshold voltages are embedded on the same chip.

On the other hand, an improvement in the scale of integration, performance and speed of semiconductor integrated circuit devices has been accompanied by a reduction in the film thickness of the gate insulating film of the MIS transistor. However, if a silicon oxide film is employed as the gate insulating film, then when the film thickness of the gate insulating film is below a predetermined value, leakage dramatically increases due to direct tunneling, resulting in an increase in current consumption of the chip.

Therefore, attention has been paid to a high-k constant insulating film made of $HfO_2$, HfSiON or the like, which has a dielectric constant three times or more as high as that of a silicon oxide film. The high-k constant insulating film may be employed as a high gate insulating film instead of a silicon oxide film.

It is here assumed that the high-k insulating film is employed as a gate insulating film in a semiconductor device comprising multi-Vt MIS transistors. In this case, the semiconductor device is fabricated by a process similar to that when, for example, a SiON film is used as the gate insulating film. A method for fabricating the conventional semiconductor device will be hereinafter briefly described with reference to FIGS. 10A to 10D. FIGS. 10A to 10D are cross-sectional views showing major steps of the conventional semiconductor device fabricating method in an order in which the device is fabricated. Note that, in these figures, a Lvt region is a region in which a p-type MIS transistor having a relatively low threshold voltage is formed, and a Hvt region is a region in which a p-type MIS transistor having a relatively high threshold voltage is formed.

Initially, as shown in FIG. 10A, an isolation region 102 is formed in an upper portion of a silicon substrate 101. Thereby, of regions surrounded by the isolation region 102 in the silicon substrate 101, a region located in the Lvt region is an active region 101a of the Lvt region, and a region located in the Hvt region is an active region 101b of the Hvt region. Thereafter, an n-type channel region 103a having a first impurity concentration is formed in an upper portion of the active region 101a in the Lvt region, and an n-type channel region 103b having a second impurity concentration higher than the first impurity concentration is formed in an upper region of the active region 101b in the Hvt region. Thereafter, a high-k insulating film 104 and a metal film 105 are successively formed on the silicon substrate 101.

Next, as shown in FIG. 10B, a polysilicon film 111 is formed on the metal film 105.

Next, as shown in FIG. 10C, the polysilicon film 111, the metal film 105 and the high-k insulating film 104 in the Lvt region are successively subjected to patterning, thereby successively forming, on the active region 101a in the Lvt region, a gate insulating film 104a made of the high-k insulating film 104, and a gate electrode 120A made of a metal film 105a and a polysilicon film 111a. The polysilicon film 111, the metal film 105 and the high-k insulating film 104 in the Hvt region are successively subjected to patterning, thereby successively forming, on the active region 101b in the Hvt region, a gate insulating film 104b made of the high-k insulating film 104, and a gate electrode 120B made of a metal film 105b and a polysilicon film 111b. Thereafter, a shallow p-type source/drain region 107a is formed in the active region 101a, and a shallow p-type source/drain region 107b is formed in the active region 101b.

Next, as shown in FIG. 10D, a sidewall 108a is formed on a side surface of the gate electrode 120A, and a sidewall 108b is formed on a side surface of the gate electrode 120B. Thereafter, a deep p-type source/drain region 109a is formed in the active region 101a, and a deep p-type source/drain region 109b is formed in the active region 101b. Thereafter, silicide films 110a1 and 110b1 are formed in upper portions of the deep p-type source/drain regions 109a and 109b, respectively, and silicide films 110a2 and 110b2 are formed in upper portions of the polysilicon films 101a and 101b in the gate electrodes 120A and 120B, respectively.

SUMMARY OF THE INVENTION

In general, in a semiconductor device in which MIS transistors having different threshold voltages are embedded on the same chip, the impurity concentration of a channel region (see 103b in FIG. 10D) in a MIS transistor having a high voltage needs to be adjusted to be higher than that of a channel region (see 103a in FIG. 10D) in a MIS transistor having a low threshold voltage. Thereby, the threshold voltage of the high threshold voltage MIS transistor is controlled to be higher than that of the low threshold voltage MIS transistor.

However, in this case, since the channel region of the high threshold voltage MIS transistor has a relatively high impurity concentration, carriers collide with conductivity type impurities contained in the channel region to be scattered during an operation of the semiconductor device, so that the mobility of the carriers is decreased and therefore the drive force is reduced in the high threshold voltage MIS transistor.

Therefore, in order to uniformly reduce the impurity concentrations of the channel regions in the Lvt and Hvt regions, a MIS transistor having a near-midgap effective work function may be used as the high threshold voltage MIS transistor instead of a MIS transistor having a near-band edge effective work function. Since the impurity concentration of the channel region required when the MIS transistor having a near midgap effective work function is used is lower than the impurity concentration of the channel region required when the MIS transistor having a near-band edge n effective work function, the impurity concentrations of the channel regions of the Lvt and Hvt regions can be uniformly reduced.

However, even in the method above, in order to control the threshold voltage of the high threshold voltage MIS transistor to be higher than the threshold voltage of the low threshold voltage MIS transistor, the impurity concentration of the channel region in the Hvt region needs to be adjusted to be higher than the impurity concentration of the channel region in the Lvt region. Therefore, the aforementioned problem is still not solved.

On the other hand, in order to control the threshold voltage of a MIS transistor, the Hf concentration of the gate insulating film made of a high-k insulating film (e.g., a HfSiON film) may be modified to adjust the level of Fermi level pinning (as proposed by, for example, Non-Patent Document 1: H. Nakamura et al., VLSI 2006 Tech. Symp, pp. 158-159). In this method, however, since it is considerably difficult to adjust the Hf concentration of the gate insulating film, it is also considerably difficult to control the threshold voltage of the MIS transistor.

As described above, when the impurity concentration of the channel region is adjusted so as to control the threshold voltages of MIS transistors having the same conductivity type, the drive capability of the high threshold voltage MIS transistor is reduced, so that the performance of the high threshold voltage MIS transistor cannot be improved. On the other hand, when the Hf concentration of the gate insulating film is adjusted, it is considerably difficult to control the threshold voltages of the low and high threshold voltage MIS transistors, so that both the low and high threshold voltage MIS transistors cannot be achieved with high precision. In other words, none of the aforementioned methods can achieve high-performance MIS transistors having different threshold voltages with high precision.

In view of the aforementioned problems, an object of the present invention is to achieve a semiconductor device comprising MIS transistors having the same conductivity type, in which the MIS transistors can be caused to have different threshold voltages with high precision and have high performance.

To achieve the object, a semiconductor device according to a first aspect of the present invention includes a first MIS transistor; and a second MIS transistor having a threshold voltage higher than that of the first MIS transistor. The first MIS transistor includes a first channel region formed in a first active region of a semiconductor substrate, a first gate insulating film made of a high-k insulating film formed on the first channel region in the first active region, and a first gate electrode having a first conductive portion provided on and contacting the first gate insulating film and a second conductive portion formed on the first conductive portion. The second MIS transistor includes a second channel region formed in a second active region of the semiconductor substrate and having the same conductivity type as that of the first channel region, a second gate insulating film made of the high-k insulating film formed on the second channel region in the second active region, and a second gate electrode having a third conductive portion provided on and contacting the second gate insulating film and a fourth conductive portion formed on the third conductive portion. The third conductive portion has a film thickness smaller than that of the first conductive portion, and is made of the same composition material as that of the first conductive portion.

According to the semiconductor device of the first aspect of the present invention, the film thickness of the third conductive portion on which the fourth conductive portion is formed is caused to be smaller than the film thickness of the first conductive portion on which the second conductive portion is formed. Thereby, the threshold voltage of the second MIS transistor having the second gate electrode made of the third conductive portion and the fourth conductive portion is controlled to be higher than the threshold voltage of the first MIS transistor having the first gate electrode made of the first conductive portion and the second conductive portion.

Therefore, as is different from the conventional art, it is not necessary to cause the impurity concentration of the second channel region to be sufficiently higher than the impurity concentration of the first channel region, and the impurity concentration of the second channel region can be caused to be the same as the impurity concentration of the first channel region (or may be caused to be slightly higher than the impurity concentration of the first channel region). Therefore, during an operation of the semiconductor device, it is possible to suppress carriers from colliding with a conductivity-type impurity contained in the second channel region to be scattered. Therefore, in the second MIS transistor, the leakage current can be reduced and the drive force can be enhanced.

Also, in order to control the threshold voltages of the first and second MIS transistors, the film thicknesses of the first and third conductive portions provided on and contacting the first and second gate insulating films included in the first and second MIS transistors are adjusted, instead of adjusting the Hf concentration of the gate insulating film included in the MIS transistor as in the conventional art, thereby making it possible to control the threshold voltages of the first and second MIS transistors with ease and with high precision.

Therefore, in a semiconductor device comprising MIS transistors having the same conductivity type, the MIS transistors can be caused to have different threshold voltages with high precision and have high performance.

In the semiconductor device of the first aspect of the present invention, the first conductive portion and the third conductive portion are preferably made of a metal or a metal compound, and the second conductive portion and the fourth conductive portion are preferably made of silicon.

In the semiconductor device of the first aspect of the present invention, the second MIS transistor having the second gate insulating film and the second gate electrode preferably has an effective work function closer to a midgap work function of silicon than the first MIS transistor having the first gate insulating film and the first gate electrode is.

In the semiconductor device of the first aspect of the present invention, the first MIS transistor and the second MIS transistor are preferably p-type MIS transistors, and the first conductive portion and the third conductive portion preferably have a work function of 4.7 eV or more and 5.15 eV or less.

In the semiconductor device of the first aspect of the present invention, the first MIS transistor and the second MIS transistor are preferably p-type MIS transistors, and the first conductive portion and the third conductive portion is preferably made of a titanium nitride film, a tantalum nitride film or a tantalum carbide film.

In the semiconductor device of the first aspect of the present invention, the first MIS transistor and the second MIS transistor are preferably p-type MIS transistors. The first conductive portion and the third conductive portion are preferably made of a titanium nitride film. The first conductive portion preferably has a film thickness larger than or equal to 20 nm. The third conductive portion preferably has a film thickness smaller than or equal to 15 nm.

In the semiconductor device of the first aspect of the present invention, the first MIS transistor and the second MIS transistor are preferably n-type MIS transistors, and the first conductive portion and the third conductive portion preferably have a work function of 4.05 eV or more and 4.5eV or less.

In the semiconductor device of the first aspect of the present invention, the second channel region preferably has the same impurity concentration as that of the first channel region.

In the semiconductor device of the first aspect of the present invention, the second gate insulating film preferably has the same film thickness as that of the first gate insulating film, and the fourth conductive portion preferably has the same film thickness as that of the second conductive portion.

In the semiconductor device of the first aspect of the present invention, the first gate electrode preferably has a film thickness larger than that of the second gate electrode.

To achieve the object, a semiconductor device according to a second aspect of the present invention including a first MIS transistor, and a second MIS transistor having a threshold voltage higher than that of the first MIS transistor. The first MIS transistor includes a first channel region formed in a first active region of a semiconductor substrate, a first gate insulating film made of a high-k insulating film formed on the first channel region in the first active region, and a first gate electrode having a first conductive portion provided on and contacting the first gate insulating film. The second MIS transistor includes a second channel region formed in a second active region of the semiconductor substrate and having the same conductivity type as that of the first channel region, a second gate insulating film made of the high-k insulating film formed on the second channel region in the second active region, and a second gate electrode having a second conductive portion provided on and contacting the second gate insulating film. The second conductive portion is made of a composition material different from that of the first conductive portion.

According to the semiconductor device of the second aspect of the present invention, the first conductive portion and the second conductive portion are made of materials having different compositions. Therefore, the threshold voltage of the second MIS transistor including the second gate electrode having the second conductive portion is controlled to be higher than the threshold voltage of the first MIS transistor including the first gate electrode having the first conductive portion.

Therefore, as is different from the conventional art, it is not necessary to cause the impurity concentration of the second channel region to be sufficiently higher than the impurity concentration of the first channel region, and the impurity concentration of the second channel region can be caused to be the same as the impurity concentration of the first channel region (or may be caused to be slightly higher than the impurity concentration of the first channel region). Therefore, during an operation of the semiconductor device, it is possible to suppress carriers from colliding with a conductivity-type impurity contained in the second channel region to be scattered. Therefore, in the second MIS transistor, the leakage current can be reduced and the drive force can be enhanced.

Also, in order to control the threshold voltages of the first and second MIS transistors, conductive materials for the first and second conductive portions provided on and contacting the first and second gate insulating films included in the first and second MIS transistors are adjusted, instead of adjusting the Hf concentration of the gate insulating film included in the MIS transistor as in the conventional art, thereby making it possible to control the threshold voltages of the first and second MIS transistors with ease and with high precision.

Therefore, in a semiconductor device comprising MIS transistors having the same conductivity type, the MIS transistors can be caused to have different threshold voltages with high precision and have high performance.

In the semiconductor device of the second aspect of the present invention, the second conductive portion preferably has a work function closer to a midgap work function of silicon than that of the first conductive portion is.

In the semiconductor device of the second aspect of the present invention, the first gate electrode is preferably made only of the first conductive portion, and the second gate electrode is preferably made only of the second conductive portion.

In the semiconductor device of the second aspect of the present invention, the first gate electrode preferably has a third conductive portion formed on the first conductive portion and the second gate electrode preferably has a fourth conductive portion formed on the second conductive portion.

In the semiconductor device of the second aspect of the present invention, the first gate electrode preferably has a fifth conductive portion made of the same conductive material as that of the second conductive portion, between the first conductive portion and the third conductive portion.

In the semiconductor device of the second aspect of the present invention, the second gate electrode preferably has a fifth conductive portion made of the same conductive material as that of the first conductive portion, between the second conductive portion and the fourth conductive portion.

In the semiconductor device of the second aspect of the present invention, the third conductive portion and the fourth conductive portion are preferably made of silicon.

In the semiconductor device of the second aspect of the present invention, the first conductive portion is preferably made of a first metal or a first metal compound, and the second conductive portion is preferably made of a second metal or a second metal compound.

In the semiconductor device of the second aspect of the present invention, the first MIS transistor and the second MIS transistor are preferably p-type MIS transistors. The first conductive portion is preferably made of a titanium nitride film. The second conductive portion is preferably made of a molybdenum nitride film or a tantalum nitride film.

In the semiconductor device of the second aspect of the present invention, the second channel region preferably has the same impurity concentration as that of the first channel region.

To achieve the object, a method is provided for fabricating the semiconductor device of the first aspect of the present invention including a first MIS transistor having a first gate electrode, and a second MIS transistor having a second gate electrode and having a threshold voltage higher than that of the first MIS transistor. The method includes the steps of (a) forming, in a semiconductor substrate, a first active region and a second active region surrounded by an isolation region, (b) forming a first channel region in the first active region, and a second channel region having the same conductivity type as that of the first channel region, in the second active region, (c) after the step (b), forming a high-k insulating film on the first active region and the second active region, (d) after the step (c), forming a first gate insulating film made of the high-k insulating film on the first active region, and the first gate electrode having a first conductive portion provided on and contacting the first gate insulating film and a second conductive portion provided on the first conductive portion, forming a second gate insulating film made of the high-k insulating film on the second active region, and the second gate electrode having a third conductive portion provided on and contacting the second gate insulating film and a fourth conductive portion provided on the third conductive portion. The third conductive portion has a film thickness smaller than that of the first conductive portion, and is made of the same composition material as that of the first conductive portion.

In the method for fabricating the semiconductor device of the first aspect of the present invention, the film thickness of the third conductive portion on which the fourth conductive portion is formed is caused to be smaller than the film thickness of the first conductive portion on which the second conductive portion is formed. Thereby, the effective work function of the second MIS transistor having the second gate electrode including the third conductive portion and the fourth conductive portion can be shifted closer to the midgap than the effective work function of the first MIS transistor having the first gate electrode including the first conductive portion and the second conductive portion is. Therefore, the effective work function of the second MIS transistor can be caused to be closer to the "midgap work function of silicon" than the effective work function of the first MIS transistor is.

In the method for fabricating the semiconductor device of the first aspect of the present invention, the step (d) preferably includes (d1) forming a first metal film contacting the high-k insulating film on the first active region, (d2) after the step (d1), forming a second metal film contacting the first metal film, and the high-k insulating film on the second active region, (d3) after the step (d2), forming a silicon film on the second metal film, and (d4) after the step (d3), subjecting the silicon film, the second metal film, the first metal film and the high-k insulating film on the first active region to patterning to form the first gate insulating film made of the high-k insulating film, the first conductive portion made of the first metal film and the second metal film, and the second conductive portion made of the silicon film, and subjecting the silicon film, the second metal film and the high-k insulating film on the second active region to patterning to form the second gate insulating film made of the high-k insulating film, the third conductive portion made of the second metal film, and the fourth conductive portion made of the silicon film.

In the method for fabricating the semiconductor device of the first aspect to the present invention, the step (d) preferably includes (d1) forming a metal film contacting the high-k insulating film, (d2) after the step (d1), etching an upper potion of the metal film on the second active region to form a metal thin-film portion having a film thickness smaller than that of the metal film, (d3) after the step (d2), forming a silicon film on the metal film and the metal thin-film portion, and (d4) after the step (d3), subjecting the silicon film, the metal film and the high-k insulating film on the first active region to patterning to form the first gate insulating film made of the high-k insulating film, the first conductive portion made of the metal film, and the second conductive portion made of the silicon film, and subjecting the silicon film, the metal thin-film portion and the high-k insulating film on the second active region to patterning to form the second gate insulating film made of the high-k insulating film, the third conductive portion made of the metal thin-film portion, and the fourth conductive portion made of the silicon film.

To achieve the object, a method is provided for fabricating the semiconductor device of the second aspect of the present invention including a first MIS transistor having a first gate electrode, and a second MIS transistor having a second gate electrode and having a threshold voltage higher than that of the first MIS transistor. The method includes the steps of (a) forming, in a semiconductor substrate, a first active region and a second active region surrounded by an isolation region, (b) forming a first channel region in the first active region, and a second channel region having the same conductivity type as that of the first channel region, in the second active region, (c) after the step (b), forming a high-k insulating film on the first active region and the second active region, and (d) after the step (c), forming a first gate insulating film made of the high-k insulating film on the first active region, and the first gate electrode having a first conductive portion provided on and contacting the first gate insulating film, and forming a second gate insulating film made of the high-k insulating film on the second active region, and the second gate electrode having a second conductive portion provided on and contacting the second gate insulating film. The second conductive portion is made of a composition material different from that of the first conductive portion.

In the method for fabricating the semiconductor device of the second aspect of the present invention, the first conductive portion and the second conductive portion are made of materials having different compositions. Therefore, the work function of the second conductive portion can be caused to be closer to the "midgap work function of silicon" than the work function of the first conductive portion is, so that the effective work function of the second MIS transistor including the second gate electrode having the second conductive portion can be caused to be closer to the "midgap work function of silicon" than the effective work function of the first MIS transistor including the first gate electrode having the first conductive portion is.

In the method for fabricating the semiconductor device of the second aspect of the present invention, the step (d) preferably includes (d1) forming a first metal film contacting the high-k insulating film on the first active region, (d2) forming a second metal film contacting the high-k insulating film on the second active region, and (d3) after the steps (d1) and (d2); subjecting the first metal film and the high-k insulating film on the first active region to patterning to form the first gate insulating film made of the high-k insulating film and the first conductive portion made of the first metal film, and subjecting the second metal film and the high-k insulating film on the second active region to patterning to form the second gate insulating film made of the high-k insulating film and the second conductive portion made of the second metal film.

In the method for fabricating the semiconductor device of the second aspect of the present invention, the step (d) preferably includes (d1) forming a first metal film contacting the high-k insulating film on the first active region, (d2) forming a second metal film contacting the high-k insulating film on the second active region, (d3) after the steps (d1) and (d2), forming a silicon film on the first metal film and the second metal film, and (d4) after the step (d3), subjecting the silicon film, the first metal film and the high-k insulating film on the first active region to patterning to form the first gate insulating film made of the high-k insulating film, the first conductive portion made of the first metal film, and a third conductive portion made of the silicon film, and subjecting the silicon film, the second metal film and the high-k insulating film on the second active region to patterning to form the second gate insulating film made of the high-k insulating film, the second conductive portion made of the second metal film, and the fourth conductive portion made of the silicon film.

In the method for fabricating the semiconductor device of the second aspect of the present invention, the step (d) preferably includes (d1) forming a first metal film contacting the high-k insulating film on the first active region, (d2) after the step (d1), forming a second metal film contacting the first metal film, and the high-k insulating film on the second active region, (d3) after the step (d2), forming a silicon film on the second metal film, and (d4) after the step (d3), subjecting the silicon film, the second metal film, the first metal film and the high-k insulating film on the first active region to patterning to form the first gate insulating film made of the high-k insulating film, the first conductive portion made of the first metal film, a fifth conductive portion made of the second metal film, and a third conductive portion made of the silicon film, and subjecting the silicon film, the second metal film and the high-k insulating film on the second active region to patterning to form the second gate insulating film made of the high-k insulating film, the second conductive portion made of the second metal film, and a fourth conductive portion made of the silicon film.

As described above, according to the semiconductor device of the present invention and its fabrication method, by adjusting the film thicknesses of the conductive portions (or the conductive material of the conductive portions) provided on and contacting the first and second gate insulating films included in the first and second MIS transistors, the effective work function of the second MIS transistor is controlled to be higher than the effective work function of the first MIS transistor. Therefore, it is possible to achieve a semiconductor device comprising first and second MIS transistors having the same conductivity type, in which the first and second MIS transistors can be caused to have different threshold voltages with high precision and have high performance.

DETAILED DESCRIPTION OF THE PREFERRED EMBODIMENTS

Figure 1A:
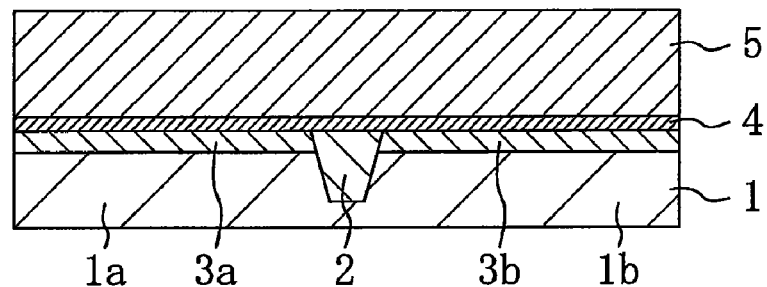
FIGS. 1A to 1D are cross-sectional views showing major steps of a method for fabricating a semiconductor device according to a first embodiment of the present invention in an order in which the device is fabricated.

Hereinafter, embodiments of the present invention will be described with reference to the accompanying drawings.

Here, the terms (1) "midgap work function of silicon", (2) "band edge", (3) "near-midgap" and "near-band edge", (4) "work function", and (5) "effective work function" as used herein are defined as follows.

(1) The term "midgap work function of silicon" refers to an intermediate value of the band gap energy of silicon. For example, the midgap work function of silicon refers to an intermediate value (about 4.6 eV) between the work function (about 4.05 eV) of silicon doped with negative electronic charges (n-type silicon) and the work function (about 5.15 eV) of silicon doped with positive electric charges (p-type silicon).

(2) The term "band edge" refers to the edge value of the band gap energy of silicon. For example, in an n-type MIS transistor, the band edge refers to the work function (about 4.05 eV) of silicon doped with negative electronic charges (n-type silicon). In a p-type MIS transistor, the band edge refers to the work function (about 5.15 eV) of silicon doped with positive electric charges (p-type silicon).

(3) The terms "near-midgap" and "near-band edge" refer to the following situation. In an n-type MIS transistor, assuming that a first work function (or an effective work function) is 4.3 eV and a second work function (or an effective work function) is 4.5 eV, the first work function (or an effective work function) is a "near-band edge" work function and the second work function (or an effective work function) is a "near-midgap" work function. On the other hand, in a p-type MIS transistor, assuming that a first work function (or an effective work function) is 4.7 eV and a second work function (or an effective work function) is 4.9 eV, the first work function (or an effective work function) is a "near-midgap" work function and the second work function (or an effective work function) is a "near-band edge" work function.

In other words, of different work functions (or effective work functions), a work function (or an effective work function) closer to the midgap work function of silicon (i.e., about 4.6 eV as described in (1) above) is a "near-midgap" work function, and a work function (or an effective work function) closer to the band edge work function (i.e., an n-type MIS transistor: about 4.05 eV, a p-type MIS transistor: about 5.15 eV as described in (2) above) is a "near-band edge" work function.

(4) The term "work function" refers to a physical property value indicating a difference between the vacuum level and the energy level of a metal (or a metal compound).

(5) The term "effective work function" refers to a work function that effectively acts to determine the threshold voltage of a MIS transistor. The "effective work function" of a MIS transistor differs from a work function that is a physical property of a metal (or a metal compound) included in the MIS transistor due to various factors in the MIS transistor.

First Embodiment

Hereinafter, a method for fabricating a semiconductor device according to a first embodiment of the present invention will be described with reference to FIGS. 1A to 1D and 2A to 2D, illustrating a specific example in which p-type MIS transistors are employed as MIS transistors having different threshold voltages. FIGS. 1A to 1D and 2A to 2D are cross-sectional views showing major steps of the fabrication method of the semiconductor device according to the first embodiment of the present invention in an order in which the device is fabricated. Note that, in this embodiment, a Lvt region is a region in which a p-type MIS transistor having a relatively low threshold voltage (hereinafter referred to as a "low threshold transistor") is formed, and a Hvt region is a region in which a p-type MIS transistor having a relatively high threshold voltage (hereinafter referred to as a "high threshold transistor") is formed.

Initially, as shown in FIG. 1A, for example, by using a Shallow Trench Isolation (STI) technique, an isolation region 2 having an insulating film buried in a trench is selectively formed in an upper portion of a substrate (hereinafter referred to as a "semiconductor substrate") 1 of one conductivity type having a semiconductor region, such as a silicon region or the like. Thereby, of regions surrounded by the isolation region 2 of the semiconductor substrate 1, a region located in the Lvt region is to be a first active region 1a and a region located in the Hvt region is to be a second active region 1b. Thereafter, although not shown, an n-type well and an n-type punch-through stopper are formed by implanting an n-type impurity ion into the semiconductor substrate 1. Here, for example, implantation conditions for the n-type well are that the ion species to be implanted is P (phosphorus), the implantation energy is 400 keV, and the implantation dose is $1 \times 10^{13}$ cm$^{-2}$. Implantation conditions for the n-type punch-through stopper are that the ion species to be implanted is P (phosphorus), the implantation energy is 200 keV, and the implantation dose is $1 \times 10^{13}$ cm$^{-2}$. Thereafter, by implanting an n-type impurity ion into the semiconductor substrate 1, an n-type channel region 3a is formed in an upper portion of the first active region 1a, and an n-type channel region 3b is formed in an upper portion of the second active region 1b. Here, for example, implantation conditions for the n-type channel regions 3a and 3b are that the ion species to be implanted is As (arsenic), the implantation energy is 100 keV, and the implantation dose is $2 \times 10^{12}$ cm$^{-2}$. The n-type channel region 3a and the n-type channel region 3b are formed to have substantially the same impurity concentration profile.

Thereafter, as shown in FIG. 1A, a buffer insulating film (not shown) made of, for example, a silicon oxide film having a film thickness of 0.5 nm is formed on the semiconductor substrate 1, and thereafter, an insulating film (hereinafter referred to as a "high-k insulating film") 4 made of, for example, a HfSiON film having a film thickness of 4 nm (equivalent to an oxide film having a film thickness of 1 nm) is formed on the buffer insulating film. Thus, the buffer insulating film is formed between the semiconductor substrate 1 and the high-k insulating film 4. The "high-k insulating film 4" as hereinafter described refers to a film on a bottom surface of which a buffer insulating film is formed.

Thereafter, a first metal film (here, the term "metal film" refers to a film made of a metal or a metal compound) 5 made of, for example, a titanium nitride film (TiN film) having a film thickness of 100 nm is deposited on the high-k insulating film 4 by, for example, a Chemical Vapor Deposition (CVD) technique. The first metal film 5 is desirably a film made of a metal or a metal compound having a work function of 4.70 eV or more and 5.15 eV or less (e.g., 4.9 eV) which is closer to the band edge than the work function of a second metal film described below (see 6 in FIG. 1C) is.

Figure 1B:
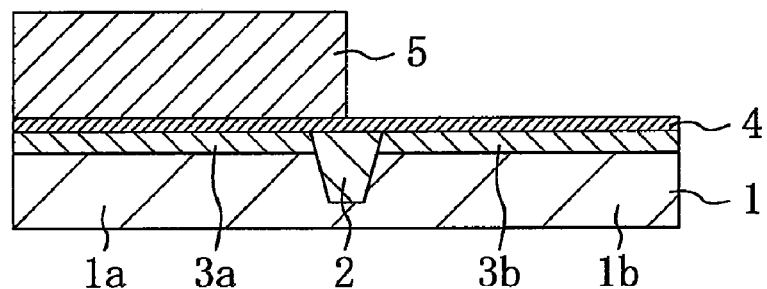

Next, as shown in FIG. 1B, a resist pattern (not shown) that covers the Lvt region while having an opening on the Hvt region is formed on the first metal film 5, and thereafter, the first metal film 5 in the Hvt region is etched using the resist pattern as a mask to remove the first metal film 5 on the second active region 1b. Thereafter, the resist pattern is removed. Thereby, the first metal film 5 can be selectively left on the first active region 1a. Thus, the first metal film 5 contacting the high-k insulating film 4 on the first active region 1a is formed.

Figure 1C:
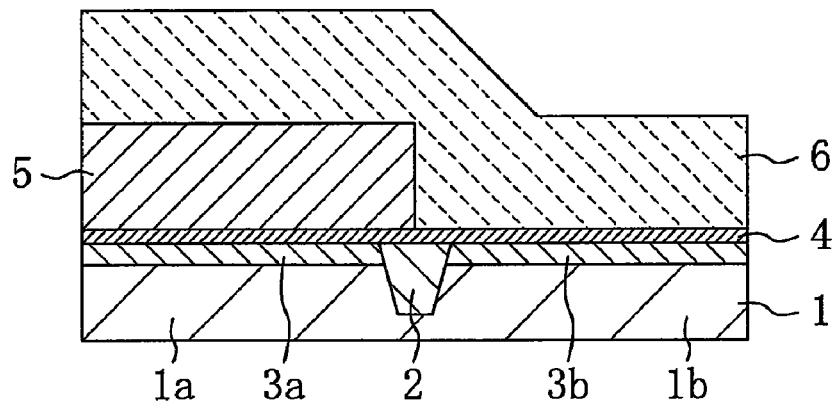

Next, as shown in FIG. 1C, a second metal film 6 made of, for example, a molybdenum nitride film (MoN film) having a film thickness of 100 nm is deposited on an entire surface of the semiconductor substrate 1 by, for example, CVD. The second metal film 6 is desirably a film made of a metal or a metal compound that has a work function of 4.6 eV or more and 5.05 eV or less (e.g., 4.7 eV) which is closer to the midgap than the work function of the first metal film 5 is. For example, a tantalum nitride film (TaN film) may be employed instead of the MoN film.

Figure 1D:
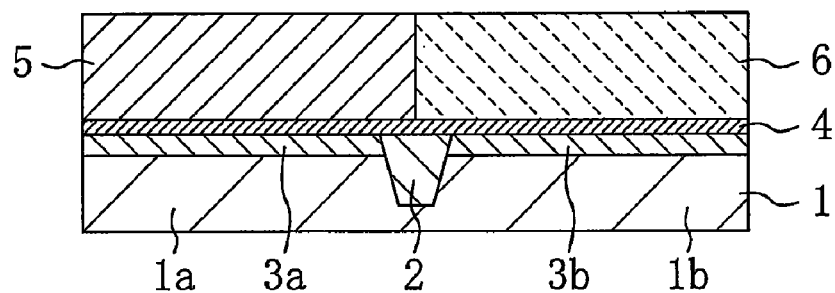

Next, as shown in FIG. 1D, the second metal film 6 is polished and removed by, for example, Chemical Mechanical Polishing (CMP) to expose an upper surface of the first metal film 5. In other words, a portion of the second metal film 6 that is located above the upper surface of the first metal film 5 is removed. Thereby, the second metal film 6 remains on the second active region 1b. An upper surface of the second metal film 6 is planarized so that its height is equal to the height of the upper surface of the first metal film 5. In other words, the first metal film 5 and the second metal film 6 are formed to have substantially the same film thickness. Thus, the second metal film 6 contacting the high-k insulating film 4 on the second active region 1b is formed.

Figure 2A:
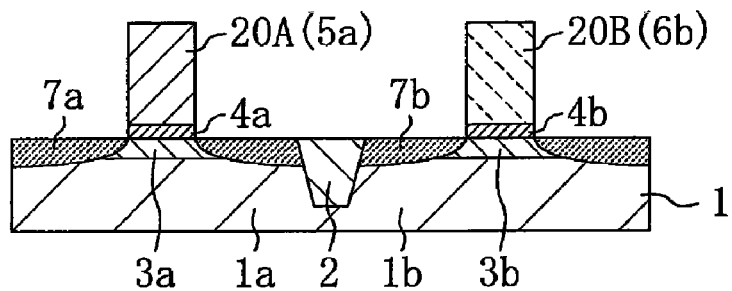
FIGS. 2A to 2D are cross-sectional views showing major steps of the method for fabricating the semiconductor device according to the first embodiment of the present invention in an order in which the device is fabricated.

Next, as shown in FIG. 2A, a resist pattern having a gate pattern shape (not shown) is formed on the first metal film 5 and the second metal film 6 by, for example, photolithography. Thereafter, the first metal film 5 and the high-k insulating film 4 in the Lvt region are successively subjected to patterning by dry etching using the resist pattern as a mask, thereby successively forming, on the first active region 1a, a first gate insulating film 4a made of the high-k insulating film 4 and a first conductive portion 5a made of the first metal film 5. In addition, the second metal film 6 and the high-k insulating film 4 in the Hvt region are successively subjected to patterning, thereby successively forming, on the second active region 1b, a second gate insulating film 4b made of the high-k insulating film 4 and a second conductive portion 6b made of the second metal film 6.

Thus, the first gate insulating film 4a, and a first gate electrode 20A having the first conductive portion 5a provided on and contacting the first gate insulating film 4a are successively formed on the first active region 1a, and the second gate insulating film 4b, and a second gate electrode 20B having the second conductive portion 6b provided on and contacting the second gate insulating film 4b are successively formed on the second active region 1b.

Thereafter, as shown in FIG. 2A, a p-type impurity ion is implanted into the first active region 1a using the first gate electrode 20A as a mask, and a p-type impurity is implanted into the second active region 1b using the second gate electrode 20B as a mask, thereby forming a p-type source/drain region (an LDD region or an extension region) 7a having a relatively shallow junction depth, in a self-aligned manner, outside the first gate electrode 20A in the first active region 1a, and a p-type source/drain region (an LDD region or an extension region) 7b having a relatively shallow junction depth, in a self-aligned manner, outside the second gate electrode 20B in the second active region 1b. Here, for example, implantation conditions for the shallow p-type source/drain regions 7a and 7b are that the ion species to be implanted is B (boron), the implantation energy is 0.5 keV, and the implantation dose is $5 \times 10^{14}$ cm$^{-2}$.

Figure 2B:
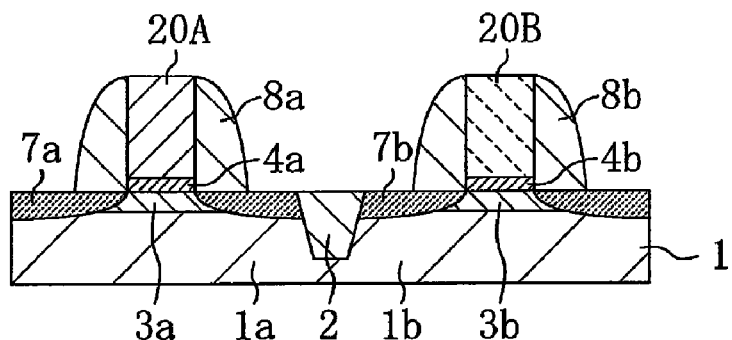

Next, as shown in FIG. 2B, an insulating film made of, for example, a silicon oxide film having a film thickness of 50 nm is deposited on an entire surface of the semiconductor substrate 1 by, for example, CVD, and thereafter, the insulating film is subjected to anisotropic etching. Thereby, a sidewall 8a is formed on a side surface of the first gate electrode 20A, and a sidewall 8b is formed on a side surface of the second gate electrode 20B.

Figure 2C:
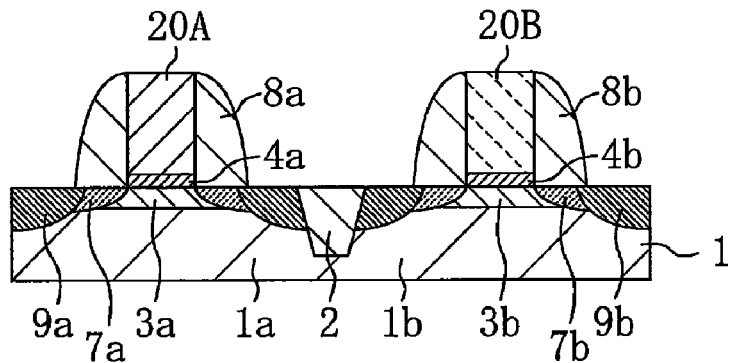

Next, as shown in FIG. 2C, a p-type impurity ion is implanted into the first active region 1a using the first gate electrode 20A and the sidewall 8a as a mask, and a p-type impurity ion is implanted into the second active region 1b using the second gate electrode 20B and the sidewall 8b as a mask. Thereafter, the semiconductor substrate 1 is subjected to a spike Rapid Thermal Annealing (RTA) treatment at, for example, 1050° C., so that a p-type source/drain region 9a having a relatively deep junction depth deeper than the junction depth of the shallow p-type source/drain region 7a is formed, in a self-aligned manner, outside the sidewall 8 in the first active region 1a, and a p-type source/drain region 9b having a relatively deep junction depth deeper than the junction depth of the shallow p-type source/drain region 7b is formed, in a self-aligned manner, outside the sidewall 8b in the second active region 1b. Here, for example, implantation conditions for the deep p-type source/drain regions 9a and 9b are that the ion species to be implanted is B (boron), the implantation energy is 2.0 keV, and the implantation dose is $3 \times 10^{15}$ cm$^{-2}$.

Figure 2D:
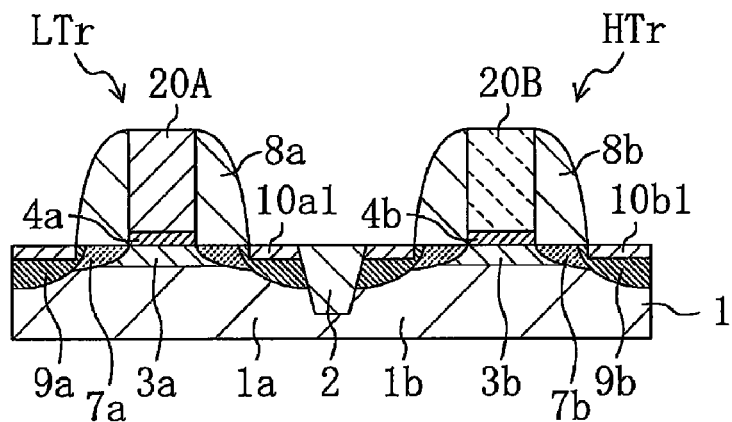

Next, as shown in FIG. 2D, a silicidation metal film made of, for example, a nickel film (Ni film) having a film thickness of 10 nm (not shown) is deposited on an entire surface of the semiconductor substrate 1 by sputtering. Thereafter, the semiconductor substrate 1 is subjected to the first RTA treatment, for example, in a nitrogen atmosphere at 320° C., thereby causing silicon in the deep p-type source/drain regions 9a and 9b and nickel in the silicidation metal film to react with each other. Thereafter, the semiconductor substrate 1 is immersed in an etchant that is a mixture of sulfuric acid and hydrogen peroxide solution, thereby removing an unreacted silicidation metal film remaining on the isolation region 2, the first conductive portion 5 in the first gate electrode 20A, the second conductive portion 6b in the second gate electrode 20B, the sidewalls 8a and 8b, and the like. Thereafter, the semiconductor substrate 1 is subjected to the second RTA treatment at a temperature (e.g., 550° C.) higher than that in the first RTA treatment. Thereby, a silicide film 10a1 made of a nickel silicide film (NiSi film) is formed in an upper portion of the deep p type source/drain region 9a in the Lvt region, and a silicide film 10b1 made of a nickel silicide film (NiSi film) is formed in an upper portion of the deep p-type source/drain region 9b in the Hvt region.

Thus, the semiconductor device of this embodiment, i.e., the semiconductor device comprising the low threshold transistor LTr having the first gate electrode 20A made of the first conductive portion 5a with a near-band edge work function and the high threshold transistor HTr having the second gate electrode 20B made of the second conductive portion 6b (having a composition different from that of the first conductive portion 5a) with a near-midgap work function, can be fabricated.

Hereinafter, a structure of the semiconductor device of the first embodiment of the present invention will be described with reference to FIG. 2D.

The isolation region 2 having an insulating film buried in a trench is formed in an upper portion of the semiconductor substrate 1, separating the first active region 1a and the second active region 1b. The semiconductor device comprises the low threshold transistor LTr provided in the first active region 1a and the high threshold transistor HTr provided in the second active region 1b.

The low threshold transistor LTr has the n-type channel region 3a formed in the first active region 1a, the first gate insulating film 4a made of a high-k insulating film formed on the n-type channel region 3a, the first gate electrode 20A made of the first conductive portion 5a provided on and contacting the first gate insulating film 4a, the sidewall 8a formed on a side surface of the first gate electrode 20A, the shallow p-type source/drain region 7a formed outside the first gate electrode 20A in the first active region 1a, the deep p-type source/drain region 9a formed outside the sidewall 8a in the first active region 1a, and the silicide film 10a1 formed in an upper portion of the deep p-type source/drain region 9a.

On the other hand, the high threshold transistor HTr has the n-type channel region 3b formed in the second active region 1b, the second gate insulating film 4b made of a high-k insulating film formed on the n-type channel region 3b, the second gate electrode 20B made of the second conductive portion 6b provided on and contacting the second gate insulating film 4b, the sidewall 8b formed on a side surface of the second gate electrode 20B, the shallow p-type source/drain region 7b formed outside the second gate electrode 20B in the second active region 1b, the deep p-type source/drain region 9b formed outside the sidewall 8b in the second active region 1b, and the silicide film 10b1 formed in an upper portion of the deep p-type source/drain region 9b.

Structural features of this embodiment will be hereinafter described.

The first conductive portion 5a included in the first gate electrode 20A of the low threshold transistor LTr is made of a TiN film and has a near-band edge work function (e.g., 4.9 eV). On the other hand, the second conductive portion 6b included in the second gate electrode 20B of the high threshold transistor HTr is made of a MoN film and has a near-midgap work function (e.g., 4.7 eV). Thus, the first conductive portion 5a and the second conductive portion 6b are made of metal films having different compositions. The first conductive portion 5a has a work function that is closer to the "band edge (about 5.15 eV, see (2) above)" than the work function of the second conductive portion 6b is. In other words, the second conductive portion 6b has a work function that is closer to the "midgap work function of silicon (about 4.6 eV, see (1) above)" than the work function of the first conductive portion 5a is. In other words, the second conductive portion 6b has a lower work function than that of the first conductive portion 5a.

The first gate insulating film 4a contacted by the first conductive portion 5a and the second gate insulating film 4b contacted by the second conductive portion 6b are formed in the same step, have the same structure, and are made of high-k insulating films having the same film thickness.

The n-type channel region 3a in the Lvt region and the n-type channel region 3b in the Hvt region are formed in the same step, and have the same structure and the same impurity concentration. Note that, as used herein, the terms "the same film thickness" and "the same impurity concentration" with respect to two parts include fabrication variations thereof that occur when the two parts are formed in the same step.

The shallow p-type source/drain regions 7a and 7b, the deep p-type source/drain regions 9a and 9b, and the sidewalls 8a and 8b are also formed in the same step and have the same structure for each pair. Note that if the first and second gate electrodes 20A and 20B have different heights, the sidewall 8a formed on a side surface of the first gate electrode 20A and the sidewall 8b formed on a side surface of the second gate electrode 20B may be formed to have different heights.

According to this embodiment, the first conductive portion 5a and the second conductive portion 6b are made of metal films having different compositions, so that the work function of the second conductive portion 6b can be caused to be closer to the "midgap work function of silicon" than the work function of the first conductive portion 5a is, and the effective work function of the high threshold transistor HTr having the second gate electrode 20B made of the second conductive portion 6b can be caused to be lower than the effective work function of the low threshold transistor LTr having the first gate electrode 20A made of the first conductive portion 5a. In other words, the threshold voltage of the high threshold transistor HTr can be caused to be higher than the threshold voltage of the low threshold transistor LTr.

Therefore, as is different from the conventional art, it is not necessary to cause the impurity concentration of the n-type channel region (see 103b in FIG. 10D) in the Hvt region to be higher than the impurity concentration of the n-type channel region (see 103a in FIG. 10D) in the Lvt region, so that the impurity concentration of the n-type channel region 3b can be caused to have the same impurity concentration as that of the n-type channel region 3a. Therefore, during an operation of the semiconductor device, it is possible to suppress carriers from colliding with the n-type impurity contained in the n-type channel region 3b to be scattered. Therefore, the leakage current can be reduced and the drive force can be enhanced in the high threshold transistor HTr.

Also, in order to control the threshold voltages of the low and high threshold transistors, conductive materials for the conductive portions provided on and contacting the gate insulating films included in the low and high threshold transistors are adjusted, instead of adjusting the Hf concentrations of the gate insulating films included in the low and high threshold transistors as in the conventional art, thereby making it possible to control the threshold voltages of the low and high threshold transistors with ease and with high precision.

Therefore, in a semiconductor device comprising MIS transistors having the same conductivity type, the MIS transistors can be caused to have different threshold voltages with high precision and have high performance.

Although it has been described with reference to the specific example in this embodiment that the first and second metal films 5 and 6 included in the first and second conductive portions 5a and 6b having different work functions have different compositions (e.g., the first metal film 5: TiN film, the second metal film 6: MoN film), the present invention is not limited to this. For example, even when the first and second metal films included in the first and second conductive portions have the same composition, then if the first and second metal films are formed in different manners, the first and second conductive portion can have different work functions. Alternatively, even when the first and second metal films have the same composition and are formed in the same manner, then if the first and second metal films are formed at different temperatures, the first and second conductive portion can have different work functions.

Although it has also been described with reference to the specific example in this embodiment that the n-type channel region 3a in the Lvt region and the n-type channel region 3b in the Hvt region are formed in the same step as shown in FIG. 1A so that the n-type channel regions 3a and 3b having the same impurity concentration are formed, the present invention is not limited to this. For example, the n-type channel regions having slightly different impurity concentrations may be formed. Thus, in order to achieve the low and high threshold transistors LTr and HTr having different threshold voltages, the n-type channel regions having slightly different impurity concentrations may be utilized in addition to the first and second gate electrodes made of the first and second conductive portions having different work functions.

In this case, a most portion of the difference in threshold voltage between the high threshold transistor HTr and the low threshold transistor LTr is controlled by the first and second conductive portions having different work functions, while the rest portion is finely adjusted by the n-type channel regions having slightly different impurity concentrations. To achieve this, the impurity concentration of the n-type channel region in the Hvt region may be slightly higher than the impurity concentration of the n-type channel region in the Lvt region, and a considerably small impurity concentration difference may be provided between the n-type channel region in the Lvt region and the n-type channel region in the Hvt region. Therefore, as is different from the conventional art, it is not necessary to provide a large impurity concentration difference between the n-type channel region in the Lvt region (see 103a in FIG. 10D) and the n-type channel region in the Hvt region (see 103b in FIG. 10D), thereby making it possible to suppress carriers from colliding with the n-type impurity contained in the n-type channel region in the Hvt region to be scattered during an operation of the semiconductor device.

Although it has also been described with reference to the specific example in this embodiment that after the first metal film 5 is formed on the first active region 1a as shown in FIG. 1B, the second metal film 6 is formed on the second active region 1b as shown in FIG. 1D, the present invention is not limited to this. For example, the first metal film may be formed on the first active region after the second metal film is formed on the second active region.

Although it has also been described with reference to the specific example in this embodiment that after the second metal film 6 is formed on the semiconductor substrate 1 as shown in FIG. 1C, the second metal film 6 is polished and removed by CMP as shown in FIG. 1D, and thereafter; the first metal film 5 and the second metal film 6 are subjected to patterning as shown in FIG. 2A, to form the first gate electrode 20A having only the first conductive portion 5a made of the first metal film 5, and the second gate electrode 20B having only the second conductive portion 6b made of the second metal film 6, the present invention is not limited to this. For example, after the second metal film is formed on the semiconductor substrate as in the step of FIG. 1C, the first metal film and the second metal film may be subjected to patterning to form a first gate electrode having a conductive portion made of the first metal film and a conductive portion made of the second metal film formed on that conductive portion, and a second gate electrode having only a conductive portion made of the second metal film, without polishing and removing the second metal film by CMP.

Second Embodiment

Hereinafter, a method for fabricating a semiconductor device according to a second embodiment of the present invention will be described with reference to FIGS. 3A to 3D and 4A to 4D, illustrating a specific example in which p-type MIS transistors are employed as MIS transistors having different threshold voltages. FIGS. 3A to 3D and 4A to 4D are cross-sectional views showing major steps of the fabrication method of the semiconductor device according to the second embodiment of the present invention in an order in which the device is fabricated. Note that, in FIGS. 3A to 4D, the same parts as those of the first embodiment are indicated by the same reference symbols as those shown in FIGS. 1A to 2D and will not be repeatedly described. Note that, in this embodiment, a Lvt region is a region in which a low-threshold MIS transistor is formed, and a Hvt region is a region in which a high-threshold MIS transistor is formed.

Figure 3A:
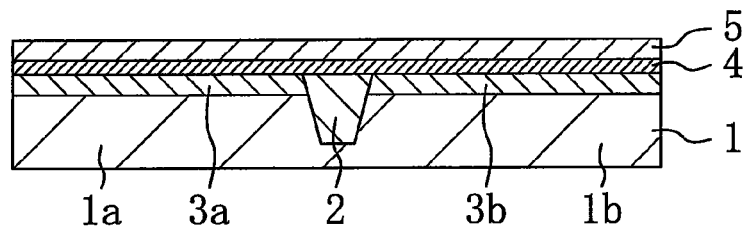
FIGS. 3A to 3D are cross-sectional views showing major steps of a method for fabricating a semiconductor device according to a second embodiment of the present invention in an order in which the device is fabricated.

Initially, a step similar to that of the first embodiment in FIG. 1A is performed to obtain a structure shown in FIG. 3A. Note that, in this embodiment, as shown in FIG. 3A, a first metal film 5 made of a TiN film having a film thickness of 20 nm is formed instead of the first metal film 5 made of a TiN film having a film thickness of 100 nm in the first embodiment. Here, the first metal film 5 of this embodiment desirably has a film thickness of 20 nm or more and a work function of 4.70 eV or more and 5.15 eV or less (e.g., 4.9 eV), and is desirably made of a metal or a metal compound having a work function that is closer to the band edge than the work function of a second metal film described below (see 6 in FIG. 3C) is.

Figure 3B:
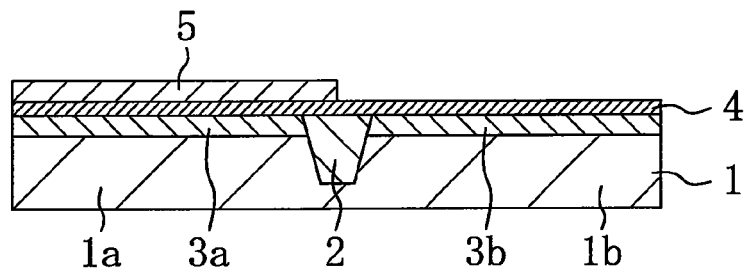

Next, as shown in FIG. 3B, a resist pattern (not shown) that covers the Lvt region while having an opening on the Hvt region is formed on the first metal film 5, and thereafter, the first metal film 5 in the Hvt region is etched using the resist pattern as a mask, thereby removing the first metal film 5 on the second active region 1b. Thereafter, the resist pattern is removed. Thereby, the first metal film 5 can be selectively left on the first active region 1a. Thus, the first metal film 5 contacting the high-k insulating film 4 on the first active region 1a is formed.

Figure 3C:
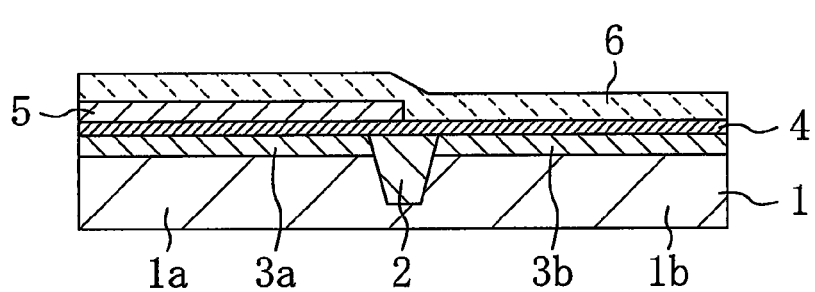

Next, as shown in FIG. 3C, a second metal film 6 made of, for example, a MoN film having a film thickness of 20 nm is deposited on an entire surface of the semiconductor substrate 1 by, for example, CVD. Thus, in this embodiment, a step similar to that of the first embodiment of FIG. 1C is performed. Note that the film thickness (e.g., 20 nm) of the second metal film 6 made of a MoN film in this embodiment is smaller than the film thickness (e.g., 100 nm) of the second metal film 6 made of a MoN film in this first embodiment. Here, the second metal film 6 of this embodiment desirably has a film thickness of 20 nm or more, has a work function of 4.6 eV or more and 5.05 eV or less (e.g., 4.7 eV), and is made of a metal or a metal compound having a work function that is closer to the midgap than the work function of the first metal film 5 is. For example, a TaN film may be used instead of a MoN film.

Figure 3D:
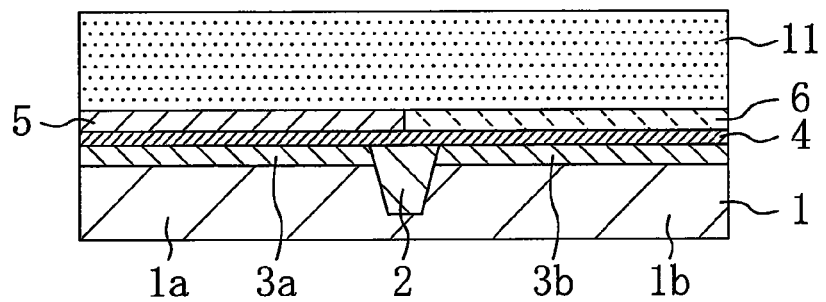

Next, as shown in FIG. 3D, a resist pattern (not shown) that covers the Hvt region while having an opening in the Lvt region and is formed on the second metal film 6, and thereafter, the second metal film 6 in the Lvt region is subjected to dry etching using the resist pattern as a mask to remove the second metal film 6 on the first metal film 5. Thereafter, the resist pattern is removed. Thereby, the second metal film 6 can be selectively left on the second active region 1b. Thus, the second metal film 6 contacting the high-k insulating film 4 on the second active region 1b is formed.

Thereafter, after a polysilicon film having a film thickness of, for example, 100 nm is formed on the first metal film 5 and the second metal film 6, a p-type impurity ion is implanted into the polysilicon film, thereby forming a silicon film 11 made of a p-type polysilicon film. Here, for example, implantation conditions for the silicon film 11 are that the ion species to be implanted is B (boron), the implantation energy is 3 keV, and the implantation dose is $1 \times 10^{15}$ cm$^{-2}$.

Figure 4A:
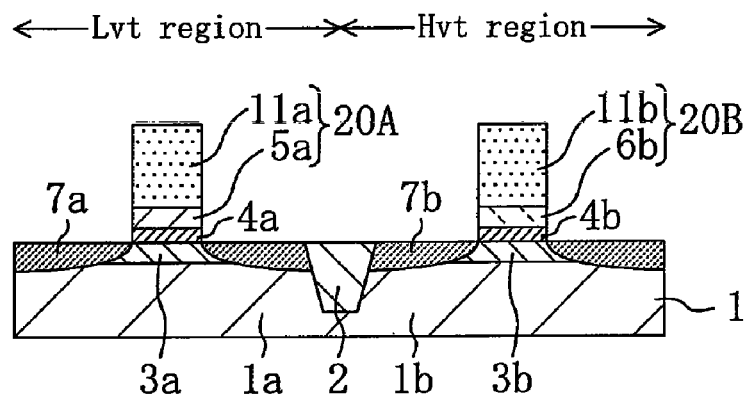
FIGS. 4A to 4D are cross-sectional views showing major steps of the method for fabricating the semiconductor device according to the second embodiment of the present invention in an order in which the device is fabricated.

Next, as shown in FIG. 4A, a resist pattern having a gate pattern shape (not shown) is formed on the silicon film 11 by, for example, photolithography. Thereafter, the silicon film 11, the first metal film 5 and the high-k insulating film 4 in the Lvt region are successively subjected to patterning by dry etching using the resist pattern as a mask, thereby successively forming, on the first active region 1a, a first gate insulating film 4a made of the high-k insulating film 4, a first conductive portion 5a made of the first metal film 5, and a third conductive portion 11a made of the silicon film 11. Also, the silicon film 11, the second metal film 6 and the high-k insulating film 4 in the Hvt region are successively subjected to patterning, thereby successively forming, on the second active region 1b, a second gate insulating film 4b made of the high-k insulating film 4, a second conductive portion 6b made of the second metal film 6, and a fourth conductive portion 11b made of the silicon film 11.

Thus, the first gate insulating film 4a, and the first gate electrode 20A having the first conductive portion 5a provided on and contacting the first gate insulating film 4a and the third conductive portion 11a formed on the first conductive portion 5a are successively formed on the first active region 1a, and the second gate insulating film 4b, and the second gate electrode 20B having the second conductive portion 6b provided on and contacting the second gate insulating film 4b and the fourth conductive portion 11b formed on the second conductive portion 6b are successively formed on the second active region 1b.

Thereafter, by using a method similar to the method of forming the shallow p-type source/drain region in the step of FIG. 2A in the first embodiment, a p-type source/drain region 7a having a relatively shallow junction depth is formed, in a self-aligned manner, outside the first gate electrode 20A in the first active region 1a, and a p-type source/drain region 7b having a relatively shallow junction depth is formed, in a self-aligned manner, outside the second gate electrode 20B in the second active region 1b.

Figure 4B:
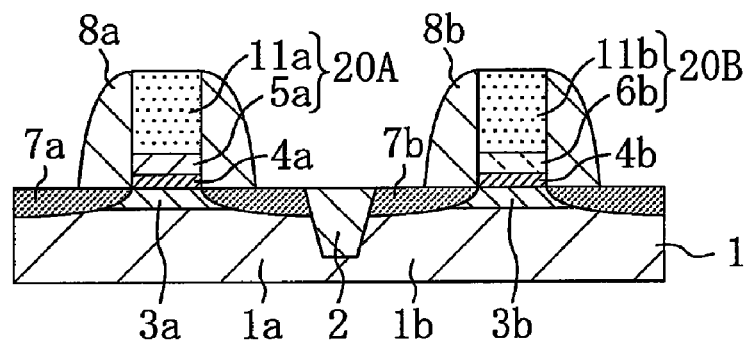

Next, as shown in FIG. 4B, by using a method similar to the method of forming the sidewall in the step of FIG. 2B in the first embodiment, a sidewall 8a is formed on a side surface of the first gate electrode 20A, and a sidewall 8b is formed on a side surface of the second gate electrode 20B.

Figure 4C:
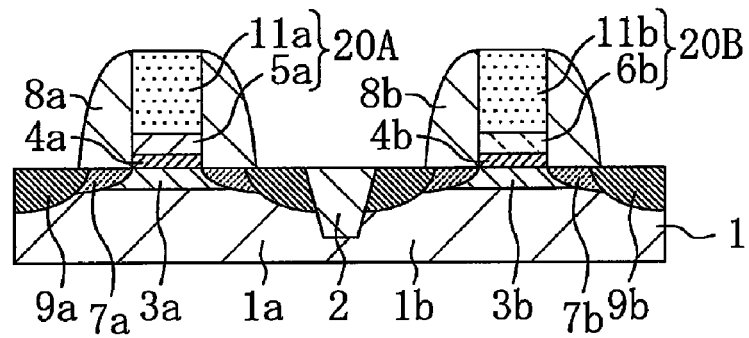

Next, as shown in FIG. 4C, by using a method similar to the method of forming the deep p-type source/drain region in the step of FIG. 2C in the first embodiment, a p-type source/drain region 9a having a relatively deep junction depth is formed, in a self-aligned manner, outside the sidewall 8a in the first active region 1a, and a p-type source/drain region 9b having a relatively deep junction depth is formed, in a self-aligned manner, outside the sidewall 8b in the second active region 1b.

Figure 4D:
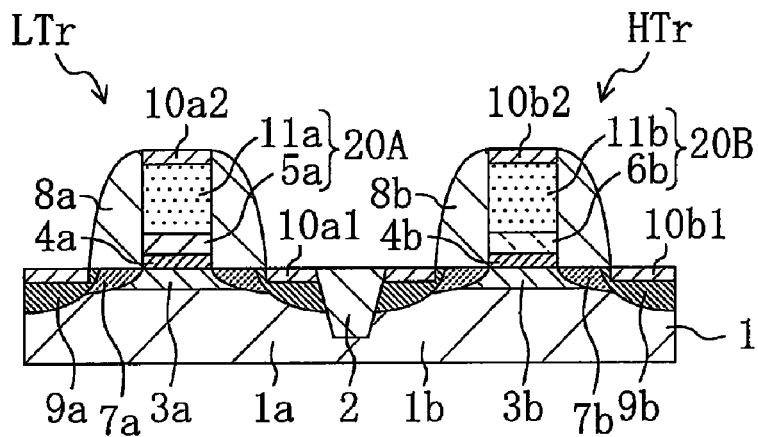

Next, as shown in FIG. 4D, a silicidation metal film (not shown) made of, for example, a Ni film having a film thickness of 10 nm is formed on an entire surface of the semiconductor substrate 1 by sputtering. Thereafter, the semiconductor substrate 1 is subjected to the first RTA treatment, for example, in a nitrogen atmosphere at 320° C., thereby causing silicon in the deep p-type source/drain regions 9a and 9b and the third and fourth conductive portions 11a and 11b to react with nickel in the silicidation metal film. Thereafter, the semiconductor substrate 1 is immersed in an etchant that is a mixture of sulfuric acid and hydrogen peroxide solution, thereby removing an unreacted silicidation metal film remaining on the isolation region 2, the sidewalls 8a and 8b and the like. Thereafter, the semiconductor substrate 1 is subjected to the second RTA treatment at a temperature (e.g., 550° C.) that is higher than that of the first RTA treatment. Thereby, silicide films 10a1 and 10b1 made of a NiSi film are formed in upper portions of the deep p-type source/drain regions 9a and 9b, and silicide films 10a2 and 10b2 made of a NiSi film are formed in upper portions of the third and fourth conductive portions 11a and 11b in the first and second gate electrodes 20A and 20B.

Thus, the semiconductor device of this embodiment, i.e., the semiconductor device comprising the low threshold transistor LTr having the first gate electrode 20A including the first conductive portion 5a with a near-band edge work function (e.g., 4.9 eV) and the third conductive portion 11a, and the high threshold transistor HTr having the second gate electrode 20B including the second conductive portion 6b with a near-midgap work function (e.g., 4.7 eV) and the fourth conductive portion 11b, can be fabricated. Thus, the first and second gate electrodes 20A and 20B of this embodiment have a so-called Metal Insert Poly-Silicon (MIPS) electrode structure including a metal film and a polysilicon film formed on the metal film.

Structural features of the semiconductor device of this embodiment will be hereinafter described with reference to FIG. 4D.

The first gate electrode 20A in the low threshold transistor LTr has the first conductive portion 5a made of the first metal film 5 and the third conductive portion 11a made of the silicon film 11. The second gate electrode 20B in the high threshold transistor HTr has the second conductive portion 6b made of the second metal film 6 and the fourth conductive portion 11b made of the silicon film 11.

The first conductive portion 5a provided on and contacting the first gate insulating film 4a and the second conductive portion 6b provided on and contacting the second gate insulating film 4b are made of metal films having different compositions (the first conductive portion 5a: TiN film, the second conductive portion 6b: MoN film). The second conductive portion 6b has a work function that is closer to the "midgap work function of silicon" than the work function of the first conductive portion 5a is.

The third conductive portion 11a formed on the first conductive portion 5a and the fourth conductive portion 11b formed on the second conductive portion 6b have the same film thickness (e.g., 100 nm) and are made of silicon films having the same composition. In other words, on the first conductive portion 5a and the second conductive portion 6b, the third and fourth conductive portions 11a and 11b made of silicon films having the same film thickness and the same composition are formed.

The first gate insulating film 4a contacted by the first conductive portion 5a and the second gate insulating film 4b contacted by the second conductive portion 6b are formed in the same step, have the same structure, and are made of high-k insulating films having the same film thickness.

The n-type channel region 3a in the Lvt region and the n-type channel region 3b in the Hvt region are formed in the same step, and have the same structure and the same impurity concentration.

The shallow p-type source/drain regions 7a and 7b, the deep p-type source/drain regions 9a and 9b, and the sidewalls 8a and 8b are also formed in the same step and have the same structure for each pair. Note that if the first and second gate electrodes 20A and 20B have different heights, the sidewall 8a formed on a side surface of the first gate electrode 20A and the sidewall 8b formed on a side surface of the second gate electrode 20B may be formed to have different heights.

According to this embodiment, the first conductive portion 5a and the second conductive portion 6b are made of metal films having different compositions, so that the work function of the second conductive portion 6b can be caused to be closer to the "midgap work function of silicon" than the work function of the first conductive portion 5a is, and the effective work function of the high threshold transistor HTr having the second gate electrode 20B made of the second conductive portion 6b and the fourth conductive portion 11b can be caused to be lower than the effective work function of the low threshold transistor LTr having the first gate electrode 20A made of the first conductive portion 5a and the third conductive portion 11a. In other words, the threshold voltage of the high threshold transistor HTr can be caused to be higher than the threshold voltage of the low threshold transistor LTr. Therefore, the low and high threshold transistors LTr and HTr having different threshold voltages can be achieved with high precision.

In addition, as shown in FIG. 4A, patterning is performed while the silicon film 11 is formed on the first metal film 5, thereby forming the first gate electrode 20A, and patterning is performed while the silicon film 11 is formed on the second metal film 6, thereby forming the second gate electrode 20B. Therefore, the precision of patterning of the first and second gate electrodes 20A and 20B can be significantly improved.

Thus, in this embodiment, in addition to an effect similar to that of the first embodiment, the first and second gate electrodes 20A and 20B having precise patterns can be achieved.

Specifically, the first gate electrode 20A of this embodiment has the first conductive portion 5a having a relatively small film thickness, and the third conductive portion 11a that is easier to pattern than the first conductive portion 5a. Similarly, the second gate electrode 20B of this embodiment has the second conductive portion 6b having a relatively small film thickness, and the fourth conductive portion 11b that is easier to pattern than the second conductive portion 6b.

Although it has been described with reference to the specific example in this embodiment that the second metal film 6 on the first metal film 5 is removed by dry etching as shown in FIG. 3D, the present invention is not limited to this. For example, as is similar to the step of FIG. 1D in the first embodiment, the second metal film 6 on the first metal film 5 may be polished and removed by CMP.

Although it has also been described with reference to the specific example in this embodiment that after the first metal film 5 is formed on the first active region 1a as shown in FIG. 3B, the second metal film 6 is formed on the second active region 1b as shown in FIG. 3D, the present invention is not limited to this. For example, the first metal film may be formed on the first active region after the second metal film is formed on the second active region.

Third Embodiment

Hereinafter, a method for fabricating a semiconductor device according to a third embodiment of the present invention will be described with reference to FIGS. 5A to 5D, illustrating a specific example in which p-type MIS transistors are employed as MIS transistors having different threshold voltages. FIGS. 5A to 5D are cross-sectional views showing major steps of the fabrication method of the semiconductor device according to the third embodiment of the present invention in an order in which the device is fabricated. Note that, in FIGS. 5A to 5D, the same parts as those of the first embodiment or the second embodiment are indicated by the same reference symbols as those shown in FIGS. 1A to 2D in the first embodiment or those shown in FIGS. 3A to 4D in the second embodiment, and will not be repeatedly described. Note that, in this embodiment, a Lvt region is a region in which a low-threshold MIS transistor is formed, and a Hvt region is a region in which a high-threshold MIS transistor is formed.

Differences in fabrication method between the second embodiment and this embodiment will be hereinafter described.

In the second embodiment, as shown in FIG. 3D, after the second metal film 6 on the first metal film 5 is removed, the silicon film 11 is formed on the first metal film 5 and the second metal film 6. In this embodiment, as shown in FIG. 5A described below, the silicon film 11 is formed on the second metal film 6 while the second metal film 6 on the first metal film 5 is not removed, i.e., the second metal film 6 is left on the first metal film 5.

Initially, the steps of FIGS. 3A to 3C in the second embodiment are successively performed to obtain the structure of FIG. 3C.

Figure 5A:
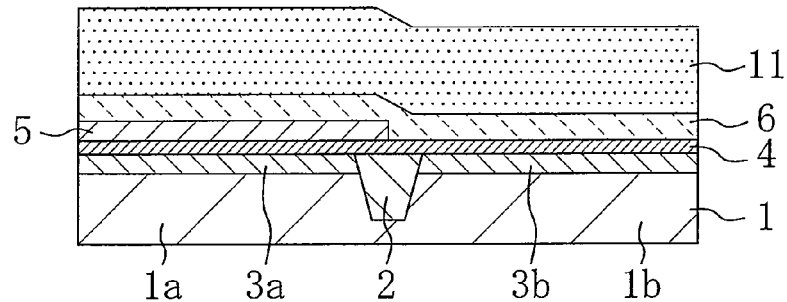
FIGS. 5A to 5D are cross-sectional views showing major steps of a method for fabricating a semiconductor device according to a third embodiment of the present invention in an order in which the device is fabricated.

Next, as shown in FIG. 5A, for example, after a polysilicon film having a film thickness of 100 nm is formed on the second metal film 6, a p-type impurity ion is implanted into the polysilicon film, thereby forming the silicon film 11 made of a p-type polysilicon film. Note that implantation conditions for the silicon film 11 are the same as those of the second embodiment.

Figure 5B:
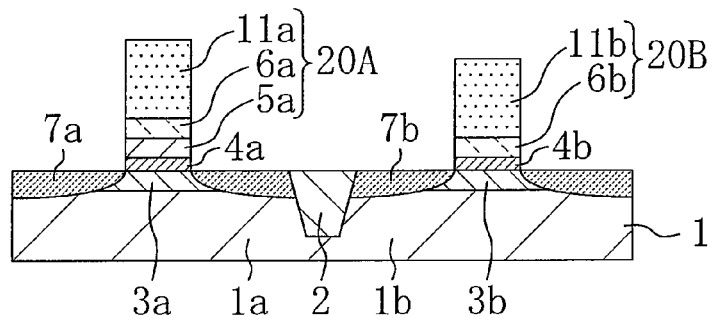

Next, as shown in FIG. 5B, a resist pattern having a gate pattern shape (not shown) is formed on the silicon film 11 by, for example, photolithography. Thereafter, the silicon film 11, the second metal film 6, the first metal film 5 and the high-k insulating film 4 in the Lvt region are successively subjected to patterning by dry etching using the resist pattern as a mask, thereby successively forming, on the first active region 1a, a first gate insulating film 4a made of the high-k insulating film 4, a first conductive portion 5a made of the first metal film 5, a fifth conductive portion 6a made of the second metal film 6, and a third conductive portion 11a made of the silicon film 11. Also, the silicon film 11, the second metal film 6 and the high-k insulating film 4 in the Hvt region are successively subjected to patterning, thereby successively forming, on the second active region 1b, a second gate insulating film 4b made of the high-k insulating film 4, a second conductive portion 6b made of the second metal film 6, and a fourth conductive portion 11b made of the silicon film 11.

Thus, the first gate insulating film 4a, and a first gate electrode 20A having the first conductive portion 5a provided on and contacting the first gate insulating film 4a, the fifth conductive portion 6a formed on the first conductive portion 5a and the third conductive portion 11a formed on the fifth conductive portion 6a are successively formed on the first active region 1a, and the second gate insulating film 4b, and a second gate electrode 20B having the second conductive portion 6b provided on and contacting the second gate insulating film 4b and the fourth conductive portion 11b formed on the second conductive portion 6b are successively formed on the second active region 1b.

Thereafter, by using a method similar to the method of forming the shallow p-type source/drain region in the step of FIG. 2A in the first embodiment, a p-type source/drain region 7a having a relatively shallow junction depth is formed, in a self-aligned manner, outside the first gate electrode 20A in the first active region 1a, and a p-type source/drain region 7b having a relatively shallow junction depth is formed, in a self-aligned manner, outside the second gate electrode 20B in the second active region 1b.

Figure 5C:
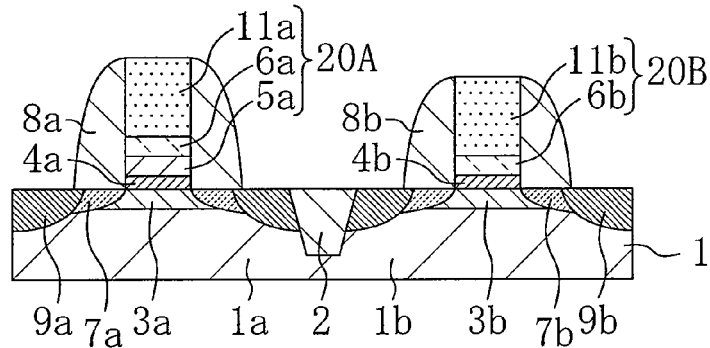

Next, as shown in FIG. 5C, by using a method similar to the method of forming the sidewall in the step of FIG. 2B in the first embodiment, a sidewall 8a is formed on a side surface of the first gate electrode 20A, and a sidewall 8b is formed on a side surface of the second gate electrode 20B. Thereafter, by using a method similar to the method of forming the deep p-type source/drain region in the step of FIG. 2C in the first embodiment, a p-type source/drain region 9a having a relatively deep junction depth is formed, in a self-aligned manner, outside the sidewall 8a in the first active region 1a, and a p-type source/drain region 9b having a relatively deep junction depth is formed, in a self-aligned manner, outside the sidewall 8b in the second active region 1b.

Figure 5D:
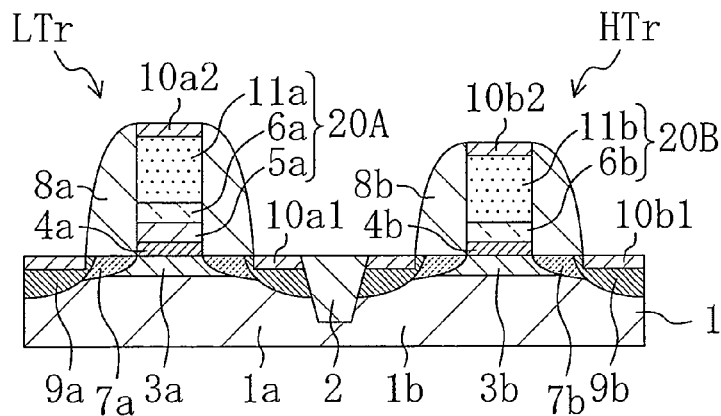

Next, as shown in FIG. 5D, by using a method similar to the method of forming the silicide film in the step of FIG. 4D in the second embodiment, silicide films 10a1 and 10b1 made of a NiSi film are formed in upper portions of the deep p-type source/drain regions 9a and 9b, and silicide films 10a2 and 10b2 made of a NiSi film are formed in upper portions of the third and fourth conductive portions 11a and 11b in the first and second gate electrodes 20A and 20B.

Thus, the semiconductor device of this embodiment, i.e., the semiconductor device comprising the low threshold transistor LTr having the first gate electrode 20A including the first conductive portion 5a with a near-band edge work function (e.g., 4.9 eV), the fifth conductive portion 6a and the third conductive portion 11a, and the high threshold transistor HTr having the second gate electrode 20B including the second conductive portion 6b with a near-midgap work function (e.g., 4.7 eV) and the fourth conductive portion 11b, can be fabricated. Thus, the first and second gate electrodes 20A and 20B of this embodiment have a so-called Metal Insert Poly-Silicon (MIPS) electrode structure including a metal film and a polysilicon film formed on the metal film.

Differences in structure between the second embodiment and this embodiment will be hereinafter described.

The first gate electrode 20A of the low threshold transistor LTr has the first conductive portion 5a and the third conductive portion 11a in the second embodiment as shown in FIG. 4D. In this embodiment, as shown in FIG. 5D, the first gate electrode 20A of the low threshold transistor LTr has the first conductive portion 5a, the fifth conductive portion 6a, and the third conductive portion 11a. The first gate electrode 20A of this embodiment has the fifth conductive portion 6a made of the same conductive material as that of the second conductive portion 6b of he second gate electrode 20B, between the first conductive portion 5a and the third conductive portion 11a.

Here, in a transistor having a gate electrode including a lower conductive portion (the first conductive portion 5a, the second conductive portion 6b) provided on and contacting a gate insulating film and an upper conductive portion (the fifth conductive portion 6a and the third conductive portion 11a, the fourth conductive portion 11b) formed on the lower conductive portion, when the lower conductive portion has a sufficiently large film thickness, the threshold voltage of the transistor is not affected by an influence of the upper conductive portion.

In the first gate electrode 20A of this embodiment, the fifth conductive portion 6a having a near-midgap work function is interposed between the first conductive portion 5a and the third conductive portion 11a. However, since the first conductive portion 5a has a sufficiently large film thickness (e.g., 20 nm or more), the threshold voltage of the low threshold transistor LTr having the first gate electrode 20A is not affected by an influence of the fifth conductive portion 6a. Therefore, the low threshold transistor LTr of this embodiment has substantially the same threshold voltage as that of the low threshold transistor LTr of the second embodiment (i.e., the low threshold transistor LTr having the first gate electrode 20A without a conductive portion interposed between the first conductive portion 5a and the third conductive portion 11a).

According to this embodiment an effect similar to that of the second embodiment can be obtained.

In addition, as shown in FIG. 5A, the second metal film 6 is left on the first metal film 5 without removing the second metal film 6 on the first metal film 5. As is different from the second embodiment, the second metal film on the first metal film is not removed, so that the fabrication method can be simplified (see FIG. 3D).

Although it has been described with reference to the specific example in this embodiment that, as shown in FIG. 5A, after the first metal film 5 is formed on the first active region 1a, the second metal film 6 is formed on the semiconductor substrate 1, and thereafter, the silicon film 11 is formed on the second metal film 6, the present invention is not limited to this.

For example, after the second metal film is formed on the second active region, the first metal film may be formed on the semiconductor substrate, and thereafter, the silicon film may be formed on the first metal film. In this case, the gate electrode in the low threshold transistor has a conductive portion made of the first metal film and a conductive portion made of the silicon film. This structure is the same as that of the first gate electrode 20A of the second embodiment. On the other hand, the gate electrode in the high threshold transistor has a conductive portion made of the second metal film, a conductive portion made of the first metal film, and a conductive portion made of the silicon film. This structure is different from that of the second gate electrode 20B of the second embodiment. Specifically, in the structure, a conductive portion (i.e., a conductive portion having a near-band edge work function) made of the same conductive material as that of the first conductive portion 5a is interposed between the second conductive portion 6b and the fourth conductive portion 11b of the second embodiment.

However, the second conductive portion 6b provided on and contacting the second gate insulating film 4b included in the high threshold transistor HTr has a sufficiently large film thickness (e.g., 20 nm). Therefore, even when a conductive portion having a near-band edge work function is interposed between the second conductive portion 6b and the fourth conductive portion 11b, a high threshold transistor having such a gate electrode has substantially the same threshold voltage as that of a high threshold transistor having a gate electrode without the interposed conductive portion (i.e., the high threshold transistor HTr of the second embodiment).

Fourth Embodiment

Hereinafter, a method for fabricating a semiconductor device according to a fourth embodiment of the present invention will be described with reference to FIGS. 6, 7A to 7D and 8A to 8D, illustrating a specific example in which p-type MIS transistors are employed as MIS transistors having different threshold voltages.

A common feature of the first to third embodiments above and this embodiment will be hereinafter described.

This embodiment is the same as the first to third embodiments in that, instead of providing channel regions having different impurity concentrations (see 103a and 103b in FIG. 10D) or gate insulating films having different Hf concentrations between the low threshold transistor LTr and the high threshold transistor HTr as in the conventional art, low and high threshold transistors LTr and HTr having different effective work functions are provided, thereby causing the low and high threshold transistor LTr and HTr to have different threshold voltages.

On the other hand, a difference between the first to third embodiment and this embodiment will be hereinafter described.

In the first to third embodiments, the first conductive portion 5a provided on and contacting the first gate insulating film 4a included in the low threshold transistor LTr and the second conductive portion 6b provided on and contacting the second gate insulating film 4b included in the high threshold transistor HTr are made of metals or metal compounds having different compositions, so that the first and second conductive portions 5a and 6b having different work functions are provided, and therefore, the low and high threshold transistors LTr and HTr having different effective work functions are achieved.

By contrast, in this embodiment, a first conductive portion (see 12a in FIG. 8D described below) provided on and contacting a first gate insulating film included in a low threshold transistor and a third conductive portion (see 12b in FIG. 8D described below) provided on and contacting a second gate insulating film included in a high threshold transistor are made of metals or metal compounds having the same composition and different film thicknesses. Second and fourth conductive portions (see 13a and 13b in FIG. 8D described below) having the same film thickness and made of silicon are provided on the first and third conductive portions. Thereby, the low and high threshold transistors having different effective work functions are achieved.

Thus, in this embodiment, attention is paid to a feature of a gate electrode having a conductive portion made of a metal film and a conductive portion made of a silicon film formed thereon that the effective work function of the transistor varies depending on the film thickness of the metal film. Based on the relationship between the effective work function of the transistor and the film thickness of the metal film, the metal film is set to have a predetermined film thickness, thereby causing the transistor to have the effective work function that can be controlled with ease and with high precision.

Figure 6:
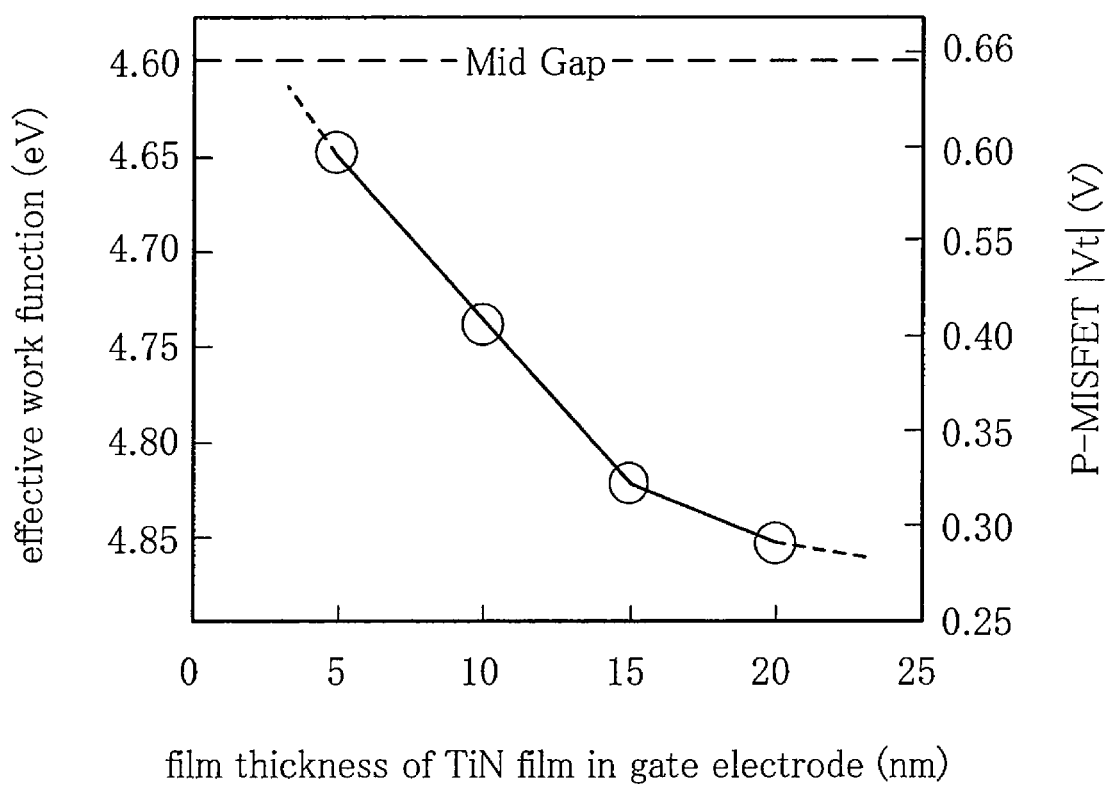
FIG. 6 is a diagram showing a relationship between the effective work function of a p-type MIS transistor and the film thickness of a TiN film.

Here, the relationship between the effective work function of the transistor and the film thickness of the metal film will be described with reference to FIG. 6, illustrating, as a specific example, a gate electrode included in a p-type MIS transistor in which the metal film formed on a gate insulating film made of a high-k insulating film is a TiN film and the silicon film is a p-type polysilicon film having a film thickness of 100 nm. FIG. 6 is a diagram showing the relationship between the effective work function of the p-type MIS transistor and the film thickness of the metal film. In FIG. 6, the horizontal axis indicates the film thickness of the TiN film in the gate electrode, the left vertical axis indicates the effective work function of the p-type MIS transistor, and the right vertical axis indicates the threshold voltage of the p-type MIS transistor.

As shown in FIG. 6, when the film thickness of the TiN film is smaller than or equal to 15 nm, the effective work function of the p-type MIS transistor sharply decreases with a decrease in the film thickness of the TiN film (in other words, the effective work function is shifted toward the midgap), so that the threshold voltage of the p-type MIS transistor sharply increases. On the other hand, when the film thickness of the TiN film is larger than or equal to 20 nm, the effective work function of the p-type MIS transistor gently increases with an increase in the film thickness of the TiN film, so that the threshold voltage of the p-type MIS transistor gently decreases.

Thus, when the film thickness of the TiN film is smaller than or equal to 15 nm, the effective work function of the p-type MIS transistor has a relatively high level of film thickness dependency. Specifically, the effective work function of the p-type MIS transistor becomes closer to the midgap as the film thickness of the TiN film is decreased. On the other hand, when the film thickness of the TiN film is larger than or equal to 20 nm, the effective work function of the p-type MIS transistor has a relatively low level of film thickness dependency. Specifically, the effective work function of the p-type MIS transistor remains closer to the band edge (i.e., about 5.15 eV). For example, when the film thickness of the TiN film is 20 nm (i.e., larger than or equal to 20 nm), the effective work function of the p-type MIS transistor is about 4.85 eV, while when the film thickness of the TiN film is 10 nm (i.e., smaller than or equal to 15 nm), the effective work function of the p-type MIS transistor is about 4.75 eV.

In other words, in a gate electrode having a conductive portion made of a metal film and a conductive portion made of a silicon film, when the film thickness of the metal film is smaller than or equal to a predetermined film thickness, the effective work function of the MIS transistor continuously shifts toward the midgap as the film thickness of the metal film is decreased. This is considered to be because whereas the effective work function of the MIS transistor is not significantly affected by an influence of the silicon film formed on the metal film if the film thickness of the metal film is sufficiently thick, the effective work function of the MIS transistor is significantly affected by an influence of the silicon film to shift toward the midgap if the film thickness of the metal film is decreased.

Thus, a conductive portion (see 12a in FIG. 8D described below) provided on and contacting a gate insulating film included in a low threshold transistor is caused to have a film thickness with a relatively low level of dependency on the effective work function (e.g., a TiN film whose film thickness is larger than or equal to 20 nm), while a conductive portion (see 12b in FIG. 8D described below) provided on and contacting a gate insulating film included in a high threshold transistor is caused to have a film thickness with a relatively high level of dependency on the effective work function (e.g., a TiN film whose film thickness is smaller than or equal to 15 nm). Thereby, the effective work function of the high threshold transistor can be shifted closer to the midgap than the effective work function of the low threshold transistor is, thereby making it possible to cause the threshold voltage of the high threshold transistor to be higher than the threshold voltage of the low threshold transistor.

Note that the relationship of FIG. 6 between the effective work function of the p-type MIS transistor and the film thickness of the metal film is satisfied not only when the p-type MIS transistor has a gate electrode in which a 100 nm-thick silicon film is formed on the metal film, but also when the p-type MIS transistor has a gate electrode in which a silicon film having a certain film thickness (e.g., 50 nm) or more is formed on the metal film.

The relationship of FIG. 6 between the effective work function of the p-type MIS transistor and the film thickness of the metal film is also satisfied not only for the p-type MIS transistor, but also for the n-type MIS transistor. Specifically, in the n-type MIS transistor having a gate electrode in which a silicon film is formed on the metal film, as the film thickness of the metal film is decreased, the effective work function of the n-type MIS transistor continuously shifts toward the midgap.

FIGS. 7A to 7D and 8A to 8D are cross-sectional views showing major steps of a method for fabricating the semiconductor device of the fourth embodiment of the present invention in an order in which the device is fabricated. Note that, in FIGS. 7A to 8D, the same parts as those of the first embodiment or the second embodiment are indicated by the same reference symbols as those shown in FIGS. 1A to 2D in the first embodiment or those shown in FIGS. 3A to 4D in the second embodiment, and will not be repeatedly described. Note that, in this embodiment, a Lvt region is a region in which a low-threshold MIS transistor is formed, and a Hvt region is a region in which a high-threshold MIS transistor is formed.

Figure 7A:
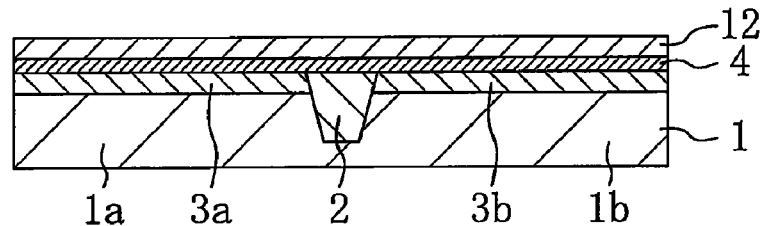
FIGS. 7A to 7D are cross-sectional views showing major steps of a method for fabricating a semiconductor device according to a fourth embodiment of the present invention in an order in which the device is fabricated.

Initially, as shown in FIG. 7A, by using, for example, STI, an isolation region 2 having an insulating film buried in a trench is selectively formed in, for example, an upper portion of a semiconductor substrate 1. Thereby, of regions surrounded by the isolation region 2 of the semiconductor substrate 1, a region located in the Lvt region is to be a first active region 1a and a region located in the Hvt region is to be a second active region 1b. Thereafter, although not shown, an n-type well and an n-type punch-through stopper are formed by implanting an n-type impurity ion into the semiconductor substrate 1. Thereafter, by implanting an n-type impurity ion into the semiconductor substrate 1, an n-type channel region 3a is formed in an upper portion of the first active region 1a, and an n-type channel region 3b is formed in an upper portion of the second active region 1b. Note that implantation conditions for each of the n-type well, the n-type punch-through stopper, and the n-type channel regions 3a and 3b are the same as those of the first embodiment.

Thereafter, as shown in FIG. 7A, a buffer insulating film (not shown) made of, for example, a silicon oxide film having a film thickness of 0.5 nm is formed on the semiconductor substrate 1, and thereafter, a high-k insulating film 4 made of, for example, a HfSiON film having a film thickness of 4 nm is formed on the buffer insulating film. Thus, the buffer insulating film is formed between the semiconductor substrate 1 and the high-k insulating film 4. The "high-k insulating film 4" as hereinafter described refers to a film on a bottom surface of which a buffer insulating film is formed.

Thereafter, a first metal film (here, the term "metal film" refers to a film made of a metal or a metal compound) 12 made of, for example, a titanium nitride film (TiN film) having a film thickness of 10 nm is deposited on the high-k insulating film 4 by, for example, CVD. The first metal film 12 is desirably has a work function of 4.7 eV or more and 5.15 eV or less (e.g., 4.9 eV). For example, a tantalum nitride film (TaN film), a tantalum carbide film (TaC film) or the like may be employed instead of the TiN film.

Figure 7B:
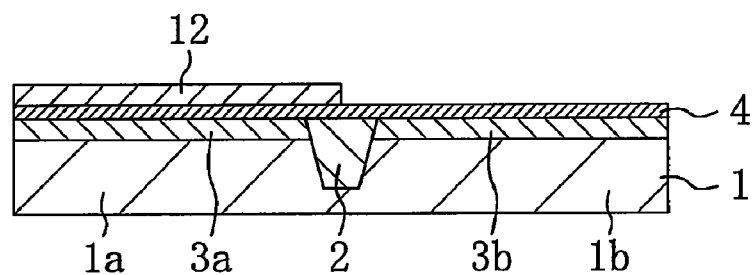

Next, as shown in FIG. 7B, a resist pattern (not shown) that covers the Lvt region while having an opening on the Hvt region is formed on the first metal film 12, and thereafter, the first metal film 12 in the Hvt region is etched using the resist pattern as a mask to remove the first metal film 12 on the second active region 1b. Thereafter, the resist pattern is removed. Thereby, the first metal film 12 can be selectively left on the first active region 1a. Thus, the first metal film 12 contacting the high-k insulating film 4 on the first active region 1a is formed.

Figure 7C:
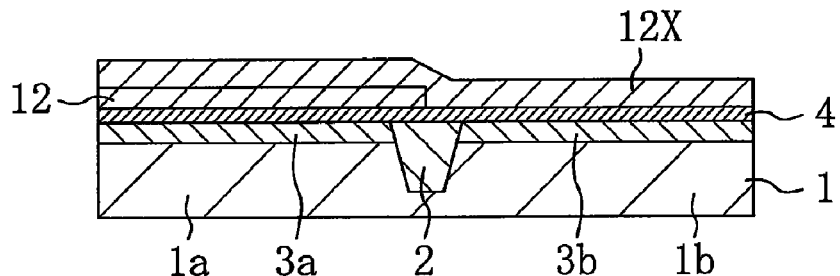

Next, as shown in FIG. 7C, a second metal film 12X made of, for example, a titanium nitride film (TiN film) having a film thickness of 10 nm is deposited on an entire surface of the semiconductor substrate 1 by, for example, CVD. Thus, the first metal film 12, and the second metal film 12X contacting the high-k insulating film 4 on the second active region 1b are formed.

Figure 7D:
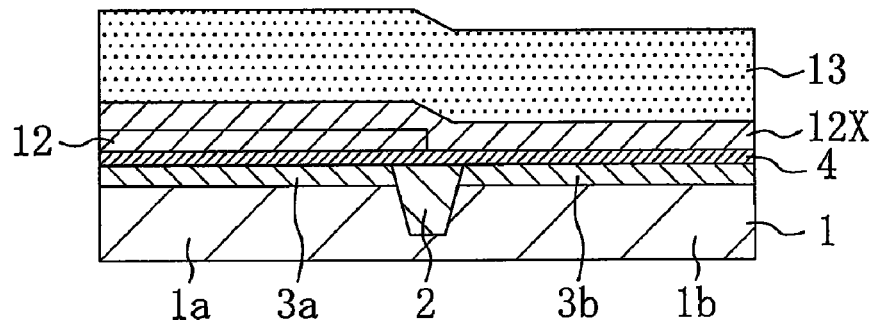

Next, as shown in FIG. 7D, for example, after a polysilicon film having a film thickness of 100 nm is formed on the second metal film 12X, a p-type impurity ion is implanted into the polysilicon film, thereby forming a silicon film 13 made of a p-type polysilicon film. Note that implantation conditions for the silicon film 13 are the same as those for the silicon film 11 of the second embodiment.

Figure 8A:
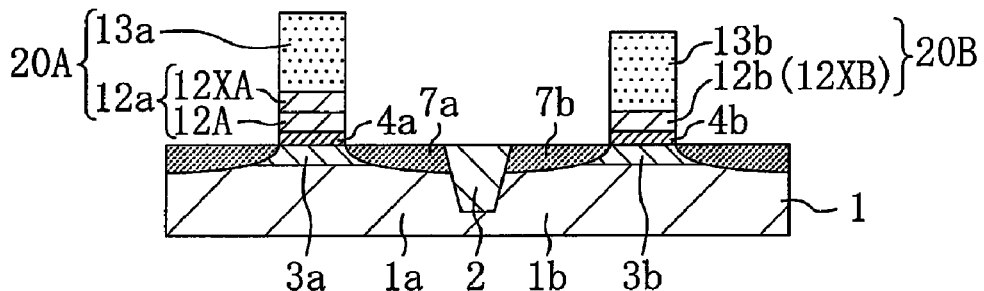
FIGS. 8A to 8D are cross-sectional views showing major steps of the method for fabricating the semiconductor device according to the fourth embodiment of the present invention in an order in which the device is fabricated.

Next, as shown in FIG. 8A, a resist pattern having a gate pattern shape (not shown) is formed on the silicon film 13 by, for example, photolithography. Thereafter, the silicon film 13, the second metal film 12X, the first metal film 12 and the high-k insulating film 4 in the Lvt region are successively subjected to patterning by dry etching using the resist pattern as a mask, thereby successively forming, on the first active region 1a, a first gate insulating film 4a made of the high-k insulating film 4, a first conductive portion 12a made of a first metal film 12A and a second metal film 12XA, and a second conductive portion 13a made of the silicon film 13. Also, the silicon film 13, the second metal film 12X and the high-k insulating film 4 in the Hvt region are successively subjected to patterning, thereby successively forming, on the second active region 1b, a second gate insulating film 4b made of the high-k insulating film 4, a third conductive portion 12b made of a second metal film 12XB, and a fourth conductive portion 13b made of the silicon film 13. In this case, the film thickness of the first conductive portion 12a is 20 nm that is the sum of the film thicknesses of the first metal film 12A and the second metal film 12XA. The film thickness of the third conductive portion 12b is 10 nm that is only the film thickness of the second metal film 12XB.

Thus, the first gate insulating film 4a, and the first gate electrode 20A having the first conductive portion 12a provided on and contacting the first gate insulating film 4a and the second conductive portion 13a provided on the first conductive portion 12a are successively formed on the first active region 1a, and the second gate insulating film 4b, and the second gate electrode 20B having the third conductive portion 12b provided on the second gate insulating film 4b and the fourth conductive portion 13b provided on the third conductive portion 12b are successively formed on the second active region 1b.

Thereafter, by using a method similar to the method of forming the shallow p-type source/drain region in the step of FIG. 2A in the first embodiment, a p-type source/drain region 7a having a relatively shallow junction depth is formed, in a self-aligned manner, outside the first gate electrode 20A in the first active region 1a, and a p-type source/drain region 7b having a relatively shallow junction depth is formed, in a self-aligned manner, outside the second gate electrode 20B in the second active region 1b.

Figure 8B:
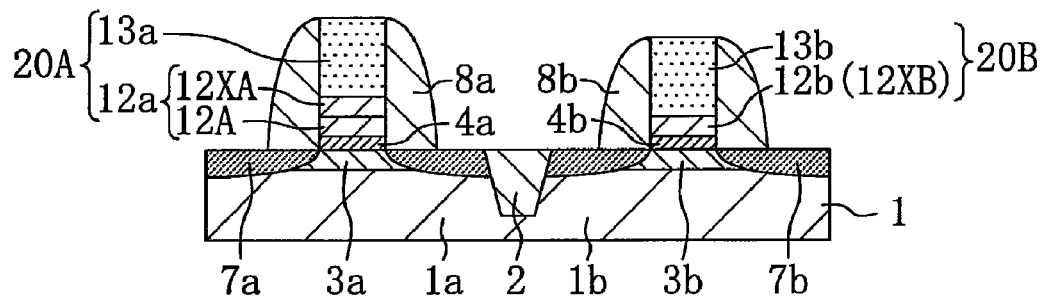

Next, as shown in FIG. 8B, by using a method similar to the method of forming the sidewall in the step of FIG. 2B in the first embodiment, a sidewall 8a is formed on a side surface of the first gate electrode 20A, and a sidewall 8b is formed on a side surface of the second gate electrode 20B.

Figure 8C:
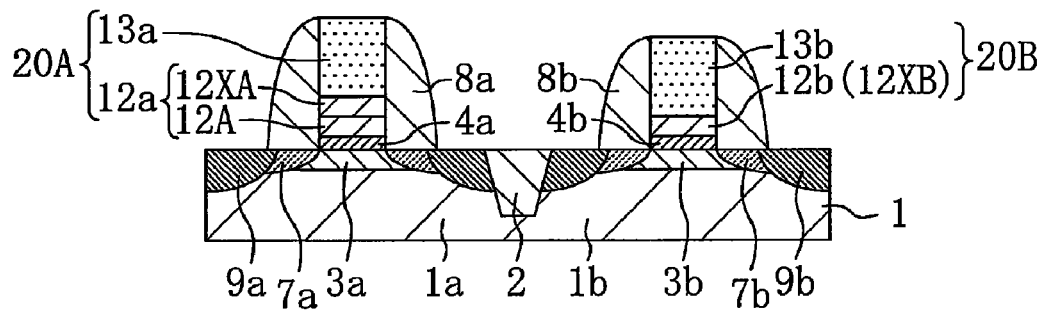

Next, as shown in FIG. 8C, by using a method similar to the method of forming the deep p-type source/drain region in the step of FIG. 2C in the first embodiment, a p-type source/drain region 9a having a relatively deep junction depth is formed, in a self-aligned manner, outside the sidewall 8a in the first active region 1a, and a p-type source/drain region 9b having a relatively deep junction depth is formed, in a self-aligned manner, outside the sidewall 8b in the second active region 1b.

Figure 8D:
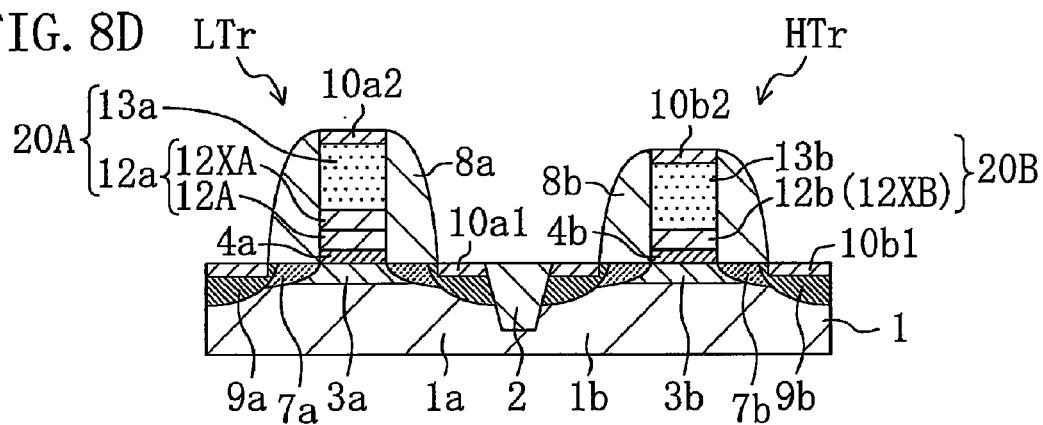

Next, as shown in FIG. 8D, by using a method similar to the method of forming the silicide film in the step of FIG. 4D in the second embodiment, silicide films 10a1 and 10b1 made of a NiSi film are formed in upper portions of the deep p-type source/drain regions 9a and 9b, and silicide films 10a2 and 10b2 made of a NiSi film are formed in upper portions of the second and fourth conductive portions 13a and 13b in the first and second gate electrodes 20A and 20B.

Thus, the semiconductor device of this embodiment, i.e., the semiconductor device comprising the low threshold transistor LTr having the first gate electrode 20A including the first conductive portion 12a having a film thickness (e.g., 20 nm) that provides a near-band edge work function (e.g., 4.85 eV) and the second conductive portion 13a, and the high threshold transistor HTr having the second gate electrode 20B including the third conductive portion 12b having the same composition as that of the first conductive portion 12a and having a film thickness (e.g., 10 nm) that provides a near-midgap work function (e.g., 4.75 eV) and the fourth conductive portion 13b, can be fabricated.

Hereinafter, a structure of the semiconductor device of the fourth embodiment of the present invention will be described with reference to FIG. 8D.

The isolation region 2 having an insulating film buried in a trench is formed in an upper portion of the semiconductor substrate 1, separating the first active region 1a and the second active region 1b. The semiconductor device comprises the low threshold transistor LTr provided in the first active region 1a and the high threshold transistor HTr provided in the second active region 1b.

The low threshold transistor LTr has the n-type channel region 3a formed in the first active region 1a, the first gate insulating film 4a made of a high-k insulating film formed on the n-type channel region 3a, the first gate electrode 20A having the first conductive portion 12a provided on and contacting the first gate insulating film 4a and the second conductive portion 13a formed on the first conductive portion 12a, the sidewall 8a formed on a side surface of the first gate electrode 20A, the shallow p-type source/drain region 7a formed outside the first gate electrode 20A in the first active region 1a, the deep p-type source/drain region 9a formed outside the sidewall 8a in the first active region 1a, the silicide film 10a1 formed in an upper portion of the deep p-type source/drain region 9a, and the silicide film 10a2 formed in an upper portion of the first gate electrode 20A.

On the other hand, the high threshold transistor HTr has the n-type channel region 3b formed in the second active region 1b, the second gate insulating film 4b made of a high-k insulating film formed on the n-type channel region 3b, the second gate electrode 20B having the third conductive portion 12b provided on and contacting the second gate insulating film 4b and the fourth conductive portion 13b formed on the third conductive portion 12b, the sidewall 8b formed on a side surface of the second gate electrode 20B, the shallow p-type source/drain region 7b formed outside the second gate electrode 20B in the second active region 1b, the deep p-type source/drain region 9b formed outside the sidewall 8b in the second active region 1b, the silicide film 10b1 formed in an upper portion of the deep p-type source/drain region 9b, and the silicide film 10b2 formed in an upper portion of the second gate electrode 20B.

Structural features of this embodiment will be hereinafter described.

The third conductive portion 12b included in the second gate electrode 20B of the high threshold transistor HTr has a film thickness smaller than that of the first conductive portion 12a included in the first gate electrode 20A of the low threshold transistor LTr, and is made of a metal or a metal compound having the same composition as that of the first conductive portion 12a, thereby having the same work function as that of the first conductive portion 12a. The second and fourth conductive portions 13a and 13b made of silicon films having the same film thickness are formed on the first conductive portion 12a and the third conductive portion 12b, respectively. Specifically, the first conductive portion 12a is made of a TiN film having a film thickness of 20 nm (i.e., larger than or equal to 20 nm), and the third conductive portion 12b is made of a TiN film having a film thickness of 10 nm (i.e., smaller than or equal to 15 nm). The second and fourth conductive portions 13a and 13b are made of a p-type polysilicon film having a film thickness of 100 nm. Thereby, as shown in FIG. 6, the low threshold transistor LTr can have an effective work function of about 4.85 eV, so that the low threshold transistor LTr can have a threshold voltage of about 0.30 V, and the high threshold transistor HTr can have an effective work function of about 4.75 eV, so that the high threshold transistor HTr can have a threshold voltage of about 0.40 V.

Thus, the first conductive portion 12a is caused to have a film thickness with a relatively low level of dependency on the effective work function, while the third conductive portion 12b is caused to have a film thickness with a relatively high level of dependency on the effective work function. Thereby, the effective work function of the high threshold transistor HTr having the second gate electrode 20B including the third conductive portion 12b and the fourth conductive portion 13b can be shifted closer to the midgap than the effective work function of the low threshold transistor LTr having the first gate electrode 20A including the first conductive portion 12a and the second conductive portion 13a is.

Therefore, the high threshold transistor HTr has an effective work function that is closer to the "midgap work function of silicon (about 4.6 eV, see (1) above) than the effective work function of the low threshold transistor LTr is. In other words, the low thresbold transistor LTr has an effective work function that is closer to the "band edge (about 5.15 eV, see (2) above) than the effective work function of the high threshold transistor HTr is. In other words, the low threshold transistor LTr has a higher effective work function than that of the high threshold transistor HTr.

The first gate insulating film 4a contacting the first conductive portion 12a and the second gate insulating film 4b contacting the third conductive portion 12b are fabricated in the same step, has the same structure, and are made of high-k insulating films having the same film thickness. Also, the second conductive portion 13a formed on the first conductive portion 12a and the fourth conductive portion 13b formed on the third conductive portion 12b are made of silicon films having the same film thickness.

The film thickness of the first gate electrode 20A including the first conductive portion 12a and the second conductive portion 13a is larger than the film thickness of the second gate electrode 20B including the third conductive portion 12b having a film thickness smaller than that of the first conductive portion 12a and the fourth conductive portion 13b having the same film thickness as that of the second conductive portion 13a. Also, the sidewall 8a formed on a side surface of the the first gate electrode 20A has a height larger than that of the sidewall 8b formed on a side surface of the second gate electrode 20B.

The n-type channel region 3a in the Lvt region and the n-type channel region 3b in the Hvt region are fabricated in the same step, and have the same structure and the same impurity concentration.

Also, the shallow p-type source/drain regions 7a and 7b, and the deep p-type source/drain regions 9a and 9b are fabricated in the same step and have the same structure for each pair.

According to this embodiment, the film thickness of the third conductive portion 12b on which the fourth conductive portion 13b is formed is caused to be smaller than the film thickness of the first conductive portion 12a on which the second conductive portion 13a is formed. Thereby, the effective work function of the high threshold transistor HTr having the second gate electrode 20B including the third conductive portion 12b and the fourth conductive portion 13b can be shifted closer to the midgap than the effective work function of the low threshold transistor LTr having the first gate electrode 20A including the first conductive portion 12a and the second conductive portion 13a is. Therefore, the effective work function of the high threshold transistor HTr can be caused to be closer to the "midgap work function of silicon" than the effective work function of the low threshold transistor LTr is, so that the threshold voltage of the high threshold transistor HTr can be caused to be higher than the threshold voltage of the low threshold transistor LTr.

Figure 10A:
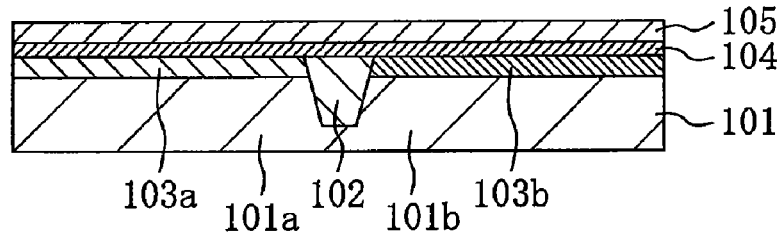
FIGS. 10A to 10D are cross-sectional views showing major steps of a method for fabricating a conventional semiconductor device in an order in which the device is fabricated.
Figure 10B:
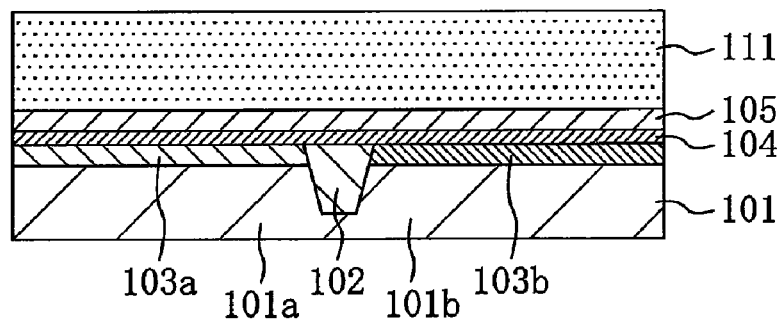
Figure 10C:
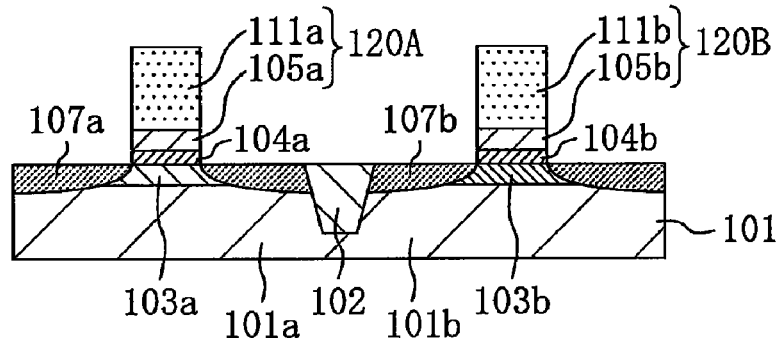
Figure 10D:
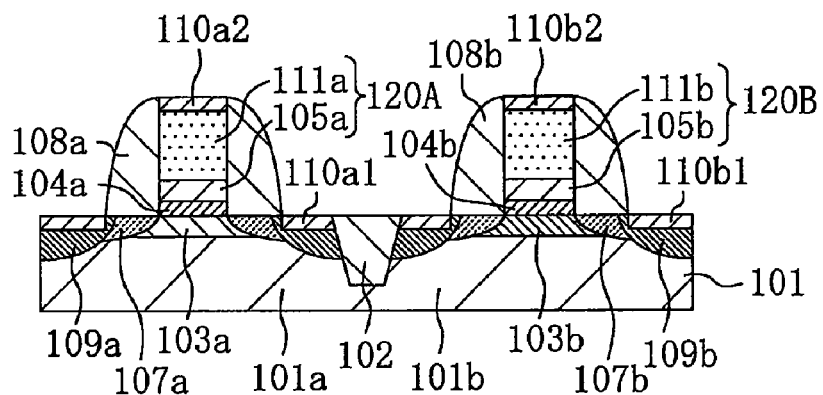

Therefore, as is different from the conventional art, it is not necessary to cause the impurity concentration of the n-type channel region in the Hvt region (see 103b in FIG. 10D) to be higher than the impurity concentration of the n-type channel region in the Lvt region (see 103a in FIG. 10D). In other words, the impurity concentration of the n-type channel region 3b can be caused to be the same as that of the n-type channel region 3a. Therefore, during an operation of the semiconductor device, it is possible to suppress carriers from colliding with the n-type impurity contained in the n-type channel region 3b to be scattered. Therefore, the leakage current can be reduced and the drive force can be enhanced in the high threshold transistor HTr.

Also, in order to control the threshold voltages of the low and high threshold transistors, the film thicknesses of the conductive portions provided on and contacting the gate insulating films included in the low and high threshold transistors are adjusted, instead of adjusting the Hf concentrations of the gate insulating films included in the low and high threshold transistors as in the conventional art, thereby making it possible to control the threshold voltages of the low and high threshold transistors with ease and with high precision.

Therefore, in a semiconductor device comprising MIS transistors having the same conductivity type, the MIS transistors can be caused to have different threshold voltages with high precision and have high performance.

Although it has been described with reference to the specific example in this embodiment that a TiN film having a film thickness (e.g., larger than or equal to 20 nm) that has a relatively low level of dependency on the effective work function is employed as the first conductive portion 12a, and a TiN film having a film thickness that has a relatively high level of dependency on the effective work function, i.e., a film thickness smaller than that of the first conductive portion 12a (e.g., smaller than or equal to 15 nm), is employed as the third conductive portion 12b, the present invention is not limited to this. For example, a TaN film or a TaC film may be used instead of the TiN film.

Specifically, if, as in this embodiment, the first and third conductive portions 12a and 12b are made of a conductive material that has a work function of 4.7 eV or more and 5.15 eV or less, and the film thickness of the third conductive portion 12b is smaller than the film thickness of the first conductive portion 12a, the effective work function of the high threshold transistor HTr can be shifted closer to the midgap than the effective work function of the low threshold transistor LTr is.

Although it has also been described with reference to the specific example in this embodiment that the second and fourth conductive portions 13a and 13b formed on the first and third conductive portions 12a and 12b are made of a p-type polysilicon film, the present invention is not limited to this. For example, an n-type polysilicon film may be employed instead of the p-type polysilicon film.

Specifically, as in this embodiment, conditions for the second and fourth conductive portions 13a and 13b may be that an effective work function obtained when the fourth conductive portion 13b and the second gate insulating film 4b are combined is closer to the midgap than an effective work function obtained when the first conductive portion 12a and the first gate insulating film 4a are combined is. Thereby, the effective work function of the high threshold transistor HTr having the second gate electrode 20B including the third conductive portion 12b and the fourth conductive portion 13b can be shifted closer to the midgap than the effective work function of the low threshold transistor LTr having the first gate electrode 20A including the first conductive portion 12a and the second conductive portion 13a is.

Although it has also been described with reference to the specific example in this embodiment that the n-type channel region 3a in the Lvt region and the n-type channel region 3b in the Hvt region are formed in the same step as shown in FIG. 7A and have the same impurity concentration, the present invention is not limited to this. For example, n-type channel regions having slightly different impurity concentrations may be formed.

Variation of Fourth Embodiment

Hereinafter, a method for fabricating a semiconductor device according to a variation of the fourth embodiment of the present invention will be described with reference to FIGS. 9A to 9D, illustrating a specific example in which p-type MIS transistors are employed as MIS transistors having different threshold voltages. FIGS. 9A to 9D are cross-sectional views showing major steps of the fabrication method of the semiconductor device according to the variation of the fourth embodiment of the present invention in an order in which the device is fabricated. Note that, in FIGS. 9A to 9D, the same parts as those of the fourth embodiment are indicated by the same reference symbols as those shown in FIGS. 7A to 8D in the fourth embodiment, and will not be repeatedly described. Note that, in this embodiment, a Lvt region is a region in which a low-threshold MIS transistor is formed, and a Hvt region is a region in which a high-threshold MIS transistor is formed.

Figure 9A:
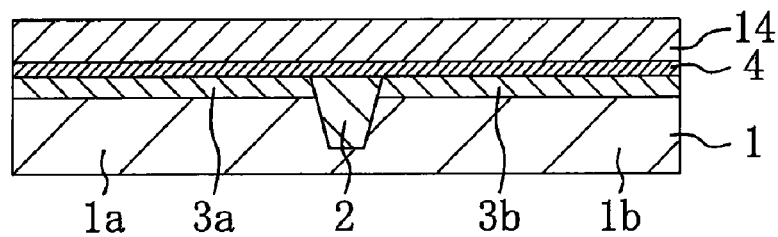
FIGS. 9A to 9D are cross-sectional views showing major steps of a method for fabricating a semiconductor device according to a variation of the fourth embodiment of the present invention in an order in which the device is fabricated.

Initially, a step similar to that of FIG. 7A in the fourth embodiment is performed to obtain a structure shown in FIG. 9A. Note that, in this variation, as shown in FIG. 9A, a metal film 14 made of a TiN film having a film thickness of 20 nm is formed instead of the first metal film 12 made of a TiN film having a film thickness of 10 nm in the fourth embodiment. Thus, the metal film 14 contacting the high-k insulating film 4 is formed.

Figure 9B:
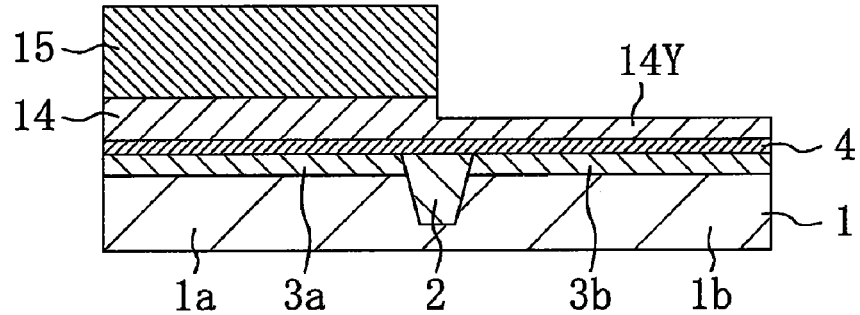

Next, as shown in FIG. 9B, a resist pattern 15 that covers the Lvt region while having an opening on the Hvt region is formed on the metal film 14, and thereafter, an upper portion of the metal film 14 on the second active region 1b is etched using the resist pattern 15 as a mask to form a metal thin-film portion 14Y having a film thickness of 10 nm. Thereafter, the resist pattern 15 is removed. Thereby, the metal film 14 having a film thickness of 20 nm can be left on the first active region 1a, and the metal thin-film portion 14Y having a film thickness smaller than that of the metal film 14 is left on the second active region 1b.

Figure 9C:
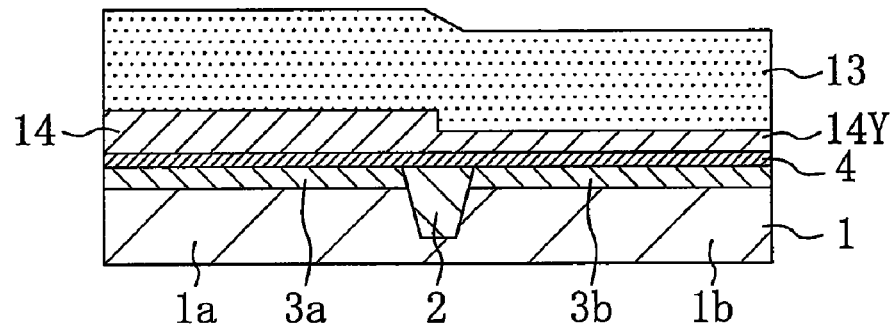

Next, as shown in FIG. 9C, for example, after a polysilicon film having a film thickness of 100 nm is formed on the metal film 14 and the metal thin-film portion 14Y, a p-type impurity ion is implanted into the polysilicon film to form a silicon film 13 made of a p-type polysilicon film. Note that implantation conditions for the silicon film 13 are the same as the implantation conditions for the silicon film 11 in the second embodiment.

Figure 9D:
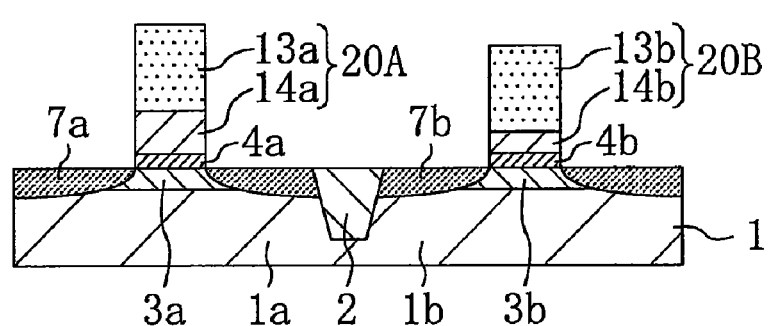

Next, as shown in FIG. 9D, a resist pattern having a gate pattern shape (not shown) is formed on the silicon film 13 by, for example, photolithography. Thereafter, the silicon film 13, the metal film 14 and the high-k insulating film 4 in the Lvt region are successively subjected to patterning by dry etching using the resist pattern as a mask, thereby successively forming, on the first active region 1a, a first gate insulating film 4a made of the high-k insulating film 4, a first conductive portion 14a made of the metal film 14, and a second conductive portion 13a made of the silicon film 13. Also, the silicon film 13, the metal thin-film portion 14Y and the high-k insulating film 4 in the Hvt region are successively subjected to patterning, thereby successively forming, on the second active region 1b, a second gate insulating film 4b made of the high-k insulating film 4, a third conductive portion 14b made of the metal thin-film portion 14Y, and a fourth conductive portion 13b made of the silicon film 13. In this case, the film thickness of the first conductive portion 14a is 20 nm that is the film thickness of the metal film 14, and the film thickness of the third conductive portion 14b is 10 nm that is the film thickness of the metal thin-film portion 14Y.

Thus, the first gate insulating film 4a, and the first gate electrode 20A having the first conductive portion 14a provided on and contacting the first gate insulating film 4a and the second conductive portion 13a provided on the first conductive portion 14a are successively formed on the first active region 1a, and the second gate insulating film 4b, and the second gate electrode 20B having the third conductive portion 14b provided on and contacting the second gate insulating film 4b and the fourth conductive portion 13b provided on the third conductive portion 14b are successively formed on the second active region 1b.

Thereafter, by using a method similar to the method of forming the shallow p-type source/drain region in the step of FIG. 2A in the first embodiment, a p-type source/drain region 7a having a relatively shallow junction depth is formed, in a self-aligned manner, outside the first gate electrode 20A in the first active region 1a, and a p-type source/drain region 7b having a relatively shallow junction depth is formed, in a self-aligned manner, outside the second gate electrode 20B in the second active region 1b. Thereafter, steps similar to those of FIGS. 8B to 8D in the fourth embodiment are successively performed, so that a semiconductor device having a structure similar to that of FIG. 8D can be fabricated.

According to this variation, an effect similar to that of the fourth embodiment can be obtained.

Although it has been described with reference to the specific examples in the first to third embodiments and the fourth embodiment and its variation that p-type MIS transistors are employed as the MIS transistors having different threshold voltages, the present invention is not limited to this. Even when n-type MIS transistors are employed, an effect similar to those of the first to third embodiments or the fourth embodiment or its variation can be obtained.

Firstly, for example, when n-type MIS transistors are employed as the MIS transistors having different threshold voltages in the first embodiment, first and second conductive materials having different work functions are selected from conductive materials having work functions of 4.05 eV or more and 4.6 eV or less. Of the first and second conductive materials, one conductive material having a work function relatively closer to the "band edge (about 4.05 eV, see (2) above" is employed as a conductive material for a conductive portion included in an n-type MIS transistor having a relatively low threshold voltage (hereinafter referred to as an "n-type low threshold transistor"), and the other conductive material having a work function relatively closer to the "midgap work function of silicon (about 4.6 eV, see (1) above)" is employed as a conductive material for a conductive portion included in an n-type MIS transistor having a relatively high threshold voltage (hereinafter referred to as an "n-type high threshold transistor"). For example, as the conductive material for the conductive portion included in the n-type low threshold transistor, a film is preferable that is made of a metal or a metal compound having a work function that is 4.05 eV or more and 4.5 eV or less (e.g., 4.3 eV) and is closer to the band edge than the work function of the conductive material for the conductive portion included in the n-type high threshold transistor is. On the other hand, as the conductive material for the conductive portion included in the n-type high threshold transistor, a film is preferable that is made of a metal or a metal compound having a work function that is 4.15 eV or more and 4.6 eV or less (e.g., 4.5 eV) and is closer to the midgap than the work function of the conductive material for the conductive portion included in the n-type low threshold transistor is.

Thus, by causing the work function of the conductive portion included in the n-type high threshold transistor to be closer to the "midgap work function of silicon" than the work function of the conductive portion included in the n-type low threshold transistor is, the effective work function of the n-type high threshold transistor can be caused to be higher than the effective work function of the n-type low threshold transistor, so that the threshold voltage of the n-type high threshold transistor can be caused to be higher than the threshold voltage of the n-type low threshold transistor. Therefore, n-type low and high threshold transistors having different threshold voltages can be achieved with high precision. In other words, an effect similar to that of the first embodiment can be obtained.

Note that, even when n-type MIS transistors are employed as the MIS transistors having different threshold voltages in the second and third embodiments, then if the work function of the conductive portion provided on and contacting the gate insulating film included in the n-type high threshold transistor is caused to be closer to the "midgap work function of silicon" than the work function of the conductive portion provided on and contacting the gate insulating film included in the n-type low threshold transistor is, an effect similar to those of the second and third embodiments can be obtained.

Secondly, for example, it is assumed that n-type MIS transistors are employed as the MIS transistors having different threshold voltages in the fourth embodiment. In this case, in n-type low and high threshold transistors each having a gate electrode including a conductive portion made of a metal film and a conductive portion made of a silicon film formed on the conductive portion, the conductive portions made of the metal films included in the n-type low and high threshold transistors is caused to have a work function of 4.05 eV or more and 4.5 eV or less, and the conductive portion made of the metal film included in the n-type high threshold transistor is caused to have a film thickness smaller than the film thickness of the conductive portion made of the metal film included in the n-type low threshold transistor. Here, examples of the conductive portion made of the silicon film include an n-type polysilicon film, a p-type polysilicon film and the like.

Thus, by causing the film thickness of the conductive portion made of the metal film included in the n-type high threshold transistor to be smaller than the film thickness of the conductive portion made of the metal film included in the n-type low threshold transistor, the effective work function of the n-type high threshold transistor can be shifted closer to the midgap than the effective work function of the n-type low threshold transistor is, so that the threshold voltage of the n-type high threshold transistor can be caused to be higher than the threshold voltage of the n-type low threshold transistor. Therefore, n-type low and high threshold transistors having different threshold voltages can be achieved with high precision. In other words, an effect similar to that of the fourth embodiment can be obtained.

Note that the high threshold transistor has an effective work function closer to the "midgap work function of silicon (about 4.6 eV, see (1) above)" than the effective work function of the low threshold MIS transistor is, irrespective of the conductivity types of the low and high threshold transistors. In other words, the low threshold MIS transistor has an effective work function closer to the "band edge (the n-type MIS transistor: 4.05 eV, the p-type MIS transistor: 5.15 eV, see (2) above)" than the effective work function of the high threshold MIS transistor is. In other words, when the conductivity types of the low and high threshold transistors are n-type, the n-type high threshold transistor has an effective work function higher than that of the n-type low threshold transistor. On the other hand, when the conductivity types of the low and high threshold transistors are p-type, the p-type high threshold transistor has an effective work function lower than that of the p-type low threshold transistor.

Although it has also been described in the first to third embodiments and the fourth embodiment and its variation that the shallow p-type source/drain regions $7a$ and $7b$ are formed by implanting a p-type impurity ion into the first and second active regions $1a$ and $1b$ using the first and second gate electrodes $20A$ and $20B$ as a mask, the present invention is not limited to this. For example, the shallow p-type source/drain region may be formed by implanting a p-type impurity ion into the first and second active regions using, as a mask, the first and second gate electrodes on side surfaces of which an offset spacer is formed.

Although it has also been described with reference to the specific examples in the first to third embodiments and the fourth embodiment and its variation that the sidewalls $8a$ and $8b$ have a monolayer structure, the present invention is not limited to this. For example, the sidewalls $8a$ and $8b$ may have a multilayer structure including an inner sidewall made of a first insulating film (e.g., a silicon oxide film) having a L-shaped cross-section and an outer sidewall made of a second insulating film (e.g., a silicon nitride film) formed on the inner sidewall.

Although it has also been described in the first to third embodiments and the fourth embodiment and its variation that a HfSiON film is employed as the high-k insulating film 4, a high-k insulating film made of a hafnium-containing metal oxide (e.g., $HfO_2$, etc.) or a metal oxide (e.g., $ZrO_2$, $TiO_2$, $Ta_2O_5$, etc.) may be instead employed.

Note that, as described above, the present invention provides a semiconductor device comprising MIS transistors having the same conductivity type, in which the MIS transistors can be caused to have different threshold voltages with high precision, and therefore, is useful for a semiconductor device and its fabrication method.

What is claimed is:
1. A semiconductor device comprising:
a first MIS transistor; and
a second MIS transistor having a threshold voltage higher than that of the first MIS transistor,
wherein the first MIS transistor includes:
a first channel region formed in a first active region of a semiconductor substrate;
a first gate insulating film made of a high-k insulating film formed on the first channel region in the first active region; and
a first gate electrode having a first conductive portion provided on and contacting the first gate insulating film and a second conductive portion formed on the first conductive portion,
the second MIS transistor includes:
a second channel region formed in a second active region of the semiconductor substrate, and having the same conductivity type as that of the first channel region;
a second gate insulating film made of the high-k insulating film formed on the second channel region in the second active region; and
a second gate electrode having a third conductive portion provided on and contacting the second gate insulating film, and a fourth conductive portion formed on the third conductive portion, and the third conductive portion has a film thickness smaller than that of the first conductive portion, and has the same composition ratio as that of the first conductive portion.

2. The semiconductor device of claim 1, wherein
the first conductive portion and the third conductive portion are made of a metal or a metal compound, and
the second conductive portion and the fourth conductive portion are made of silicon.

3. The semiconductor device of claim 1, wherein the second MIS transistor having the second gate insulating film and the second gate electrode has an effective work function closer to a midgap work function of silicon than the first MIS transistor having the first gate insulating film and the first gate electrode is.

4. The semiconductor device of claim 1, wherein
the first MIS transistor and the second MIS transistor are p-type MIS transistors; and
the first conductive portion and the third conductive portion have a work function of 4.7 eV or more and 5.15 eV or less.

5. The semiconductor device of claim 1, wherein
the first MIS transistor and the second MIS transistor are p-type MIS transistors, and
the first conductive portion and the third conductive portion is made of a titanium nitride film, a tantalum nitride film or a tantalum carbide film.

6. The semiconductor device of claim 1, wherein
the first MIS transistor and the second MIS transistor are p-type MIS transistors,
the first conductive portion and the third conductive portion are made of a titanium nitride film,
the first conductive portion has a film thickness larger than or equal to 20 nm, and
the third conductive portion has a film thickness smaller than or equal to 15 nm.

7. The semiconductor device of claim 1, wherein
the first MIS transistor and the second MIS transistor are n-type MIS transistors, and
the first conductive portion and the third conductive portion have a work function of 4.05 eV or more and 4.5 eV or less.

8. The semiconductor device of claim 1, wherein the second channel region has the same impurity concentration as that of the first channel region.

9. The semiconductor device of claim 1, wherein
the second gate insulating film has the same film thickness as that of the first gate insulating film, and
the fourth conductive portion has the same film thickness as that of the second conductive portion.

10. The semiconductor device of claim 1, wherein the first gate electrode has a film thickness larger than that of the second gate electrode.

11. A semiconductor device comprising:
a first MIS transistor; and
a second MIS transistor having a threshold voltage higher than that of the first MIS transistor,
wherein the first MIS transistor includes:
a first channel region formed in a first active region of a semiconductor substrate;
a first gate insulating film made of a high-k insulating film formed on the first channel region in the first active region; and
a first gate electrode having a first conductive portion provided on and contacting the first gate insulating film, the second MIS transistor includes:
a second channel region formed in a second active region of the semiconductor substrate, and having the same conductivity type as that of the first channel region;
a second gate insulating film made of the high-k insulating film formed on the second channel region in the second active region; and
a second gate electrode having a second conductive portion provided on and contacting the second gate insulating film, and
the second conductive portion is made of a composition material different from that of the first conductive portion,
when the first MIS transistor and the second MIS transistor are n-type MIS transistors, a work function of the first conductive portion and a work function of the second conductive portion are lower than a midgap work function of silicon, and
when the first MIS transistor and the second MIS transistor are p-type MIS transistors, a work function of the first conductive portion and a work function of the second conductive portion are higher than the midgap work function of silicon.

12. The semiconductor device of claim 11, wherein the second conductive portion has a work function closer to a midgap work function of silicon than that of the first conductive portion is.

13. The semiconductor device of claim 11, wherein
the first gate electrode is made only of the first conductive portion, and
the second gate electrode is made only of the second conductive portion.

14. The semiconductor device of claim 11, wherein
the first gate electrode has a third conductive portion formed on the first conductive portion, and
the second gate electrode has a fourth conductive portion formed on the second conductive portion.

15. The semiconductor device of claim 11, wherein
the first conductive portion is made of a first metal or a first metal compound, and
the second conductive portion is made of a second metal or a second metal compound.

16. The semiconductor device of claim 11, wherein
the first MIS transistor and the second MIS transistor are p-type MIS transistors,
the first conductive portion is made of a titanium nitride film, and
the second conductive portion is made of a molybdenum nitride film or a tantalum nitride film.

17. The semiconductor device of claim 11, wherein the second channel region has the same impurity concentration as that of the first channel region.

18. The semiconductor device of claim 14, wherein the first gate electrode has a fifth conductive portion made of the same conductive material as that of the second conductive portion, between the first conductive portion and the third conductive portion.

19. The semiconductor device of claim 14, wherein the third conductive portion and the fourth conductive portion are made of silicon.

20. The semiconductor device of claim 14, wherein the second gate electrode has a fifth conductive portion made of the same conductive material as that of the first conductive portion, between the second conductive portion and the fourth conductive portion.

* * * * *